United States Patent
Ahn et al.

(10) Patent No.: US 10,455,708 B2
(45) Date of Patent: Oct. 22, 2019

(54) MULTILAYERED SUBSTRATE AND METHOD FOR MANUFACTURING THE SAME

(71) Applicant: SAMSUNG ELECTRO-MECHANICS CO., LTD., Suwon-si (KR)

(72) Inventors: Seok-Hwan Ahn, Yongin-si (KR); Mi-Sun Hwang, Suwon-si (KR); Young-Gwan Ko, Hwaseong-si (KR); Jong-Seok Bae, Yongin-si (KR); Myung-Sam Kang, Hwaseong-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/810,343

(22) Filed: Nov. 13, 2017

(65) Prior Publication Data

US 2018/0070458 A1  Mar. 8, 2018

Related U.S. Application Data

(63) Continuation-in-part of application No. 15/196,857, filed on Jun. 29, 2016, now Pat. No. 9,832,866.

(30) Foreign Application Priority Data

Jun. 29, 2015 (KR) .................. 10-2015-0092257
Apr. 4, 2016 (KR) .................. 10-2016-0041222
Jun. 29, 2016 (KR) .................. 10-2016-0081510

(51) Int. Cl.
*H05K 1/00* (2006.01)
*H05K 1/11* (2006.01)
(Continued)

(52) U.S. Cl.
CPC ......... *H05K 3/4644* (2013.01); *H05K 1/0271* (2013.01); *H05K 1/09* (2013.01);
(Continued)

(58) Field of Classification Search
CPC ... H05K 1/00; H05K 1/11; H05K 3/24; H05K 3/46; H01L 21/02; H01L 21/48;
(Continued)

(56) References Cited

U.S. PATENT DOCUMENTS 5,046,238 A * 9/1991 Daigle ................. H05K 3/4617
228/175
5,118,385 A * 6/1992 Kumar ................ H01L 21/4857
216/105
(Continued)

FOREIGN PATENT DOCUMENTS

JP  2000-91746 A  3/2000
JP  2006-147748 A  6/2006
(Continued)

OTHER PUBLICATIONS

Korean Office Action dated Oct. 20, 2017 in corresponding Korean Application No. 10-2016-0081510 (2 pages in English and 10 pages in Korean).
(Continued)

*Primary Examiner* — Xiaoliang Chen
(74) *Attorney, Agent, or Firm* — NSIP Law

(57) ABSTRACT

A multilayered substrate in accordance with an aspect of the present disclosure may include an insulating layer, a conductive pattern embedded, at least partially, in the insulating layer, and a bump being electrically connected to the conductive pattern and penetrating the insulating layer. The bump may include a low melting point metal layer having a melting point lower than a melting point of the conductive pattern and a high melting point metal layer having a melting
(Continued)

point higher than the melting point of the low melting point metal layer and having a latitudinal cross-sectional area smaller than a latitudinal cross-sectional area of the low melting point metal layer.

9 Claims, 26 Drawing Sheets

(51) Int. Cl.
| | |
|---|---|
| H05K 3/24 | (2006.01) |
| H05K 3/46 | (2006.01) |
| H01L 21/02 | (2006.01) |
| H01L 21/48 | (2006.01) |
| H01L 23/48 | (2006.01) |
| H01L 23/58 | (2006.01) |
| H05K 1/09 | (2006.01) |
| H05K 3/06 | (2006.01) |
| H05K 1/02 | (2006.01) |
| H05K 1/16 | (2006.01) |
| H05K 3/00 | (2006.01) |

(52) U.S. Cl.
CPC .............. *H05K 1/113* (2013.01); *H05K 1/115* (2013.01); *H05K 1/165* (2013.01); *H05K 3/007* (2013.01); *H05K 3/06* (2013.01); *H05K 3/4617* (2013.01); *H05K 3/4682* (2013.01); *H05K 3/4688* (2013.01); *H05K 2201/096* (2013.01); *H05K 2201/09136* (2013.01); *H05K 2201/09454* (2013.01); *H05K 2201/09509* (2013.01); *H05K 2201/09563* (2013.01); *H05K 2201/09827* (2013.01)

(58) Field of Classification Search
CPC ......... H01L 21/56; H01L 21/60; H01L 21/70; H01L 23/48; H01L 23/58; H01L 23/485; H01L 23/498
USPC .................. 174/251, 250, 254–264, 524; 361/679.01; 257/679.01, 737, 777, 778
See application file for complete search history.

(56) References Cited

U.S. PATENT DOCUMENTS

| | | | | |
|---|---|---|---|---|
| 5,309,629 | A * | 5/1994 | Traskos | H05K 3/4617 174/262 |
| 5,321,210 | A | 6/1994 | Kimbara et al. | |
| 5,329,695 | A * | 7/1994 | Traskos | H05K 3/4617 156/89.17 |
| 5,440,805 | A * | 8/1995 | Daigle | H01L 21/4857 174/262 |
| 5,628,852 | A | 5/1997 | Ishida | |
| 6,026,564 | A | 2/2000 | Wang et al. | |
| 6,261,941 | B1 * | 7/2001 | Li | H05K 3/4647 438/618 |
| 6,262,376 | B1 * | 7/2001 | Hurwitz | H01L 21/4846 174/255 |
| 6,310,391 | B1 | 10/2001 | Nagasawa et al. | |
| 6,335,076 | B1 | 1/2002 | Nakamura et al. | |
| 6,534,723 | B1 * | 3/2003 | Asai | H01L 23/49811 174/255 |
| 6,809,421 | B1 * | 10/2004 | Hayasaka | H01L 21/76898 257/621 |
| 7,611,982 | B2 * | 11/2009 | Yoshida | H05K 1/16 257/E21.575 |
| 8,859,420 | B2 * | 10/2014 | Endo | H01L 21/4857 257/758 |
| 2001/0004944 | A1 | 6/2001 | Nakamura et al. | |
| 2001/0008310 | A1 * | 7/2001 | Sakuyama | H01L 21/4853 257/737 |
| 2002/0004180 | A1 | 1/2002 | Hotta et al. | |
| 2002/0066594 | A1 * | 6/2002 | Shintani | H01R 4/02 174/261 |
| 2002/0074641 | A1 * | 6/2002 | Towle | H01L 21/568 257/692 |
| 2002/0105094 | A1 * | 8/2002 | Sahara | H01L 21/563 257/778 |
| 2002/0157864 | A1 * | 10/2002 | Koyama | H05K 1/036 174/261 |
| 2003/0178229 | A1 | 9/2003 | Toyoda et al. | |
| 2004/0000425 | A1 * | 1/2004 | White | H01F 41/041 174/250 |
| 2004/0053489 | A1 | 3/2004 | Kata et al. | |
| 2004/0105223 | A1 * | 6/2004 | Okada | H01L 21/486 361/679.01 |
| 2007/0096289 | A1 | 5/2007 | Enomoto et al. | |
| 2008/0277776 | A1 | 11/2008 | Enomoto | |
| 2009/0016671 | A1 | 1/2009 | Asai et al. | |
| 2009/0046441 | A1 | 2/2009 | Funaya et al. | |
| 2009/0231827 | A1 | 9/2009 | Furutani et al. | |
| 2010/0052189 | A1 * | 3/2010 | Sakurai | H01L 24/11 257/778 |
| 2010/0126758 | A1 | 5/2010 | Akai et al. | |
| 2010/0132997 | A1 | 6/2010 | Hando | |
| 2010/0139968 | A1 | 6/2010 | Takenaka et al. | |
| 2010/0208437 | A1 | 8/2010 | Maeda et al. | |
| 2011/0242258 | A1 * | 10/2011 | Nishino | G03G 15/326 347/224 |
| 2013/0153269 | A1 * | 6/2013 | Takahashi | H05K 3/368 174/254 |
| 2013/0200523 | A1 | 8/2013 | Sawachi et al. | |
| 2013/0319730 | A1 * | 12/2013 | Son | H05K 1/0298 174/251 |
| 2014/0311771 | A1 | 10/2014 | Shimizu et al. | |
| 2014/0361430 | A1 | 12/2014 | Ono et al. | |
| 2015/0257256 | A1 | 9/2015 | Sato et al. | |
| 2015/0282307 | A1 | 10/2015 | Shimizu et al. | |
| 2016/0088736 | A1 | 3/2016 | Sankman et al. | |
| 2016/0155927 | A1 | 6/2016 | Kabasawa et al. | |

FOREIGN PATENT DOCUMENTS

| | | |
|---|---|---|
| JP | 2008-515241 A | 5/2008 |
| JP | 2008-218875 A | 9/2008 |
| JP | 5567716 B2 | 8/2014 |
| KR | 10-2004-0061258 A | 7/2004 |
| KR | 10-2011-0060456 A | 6/2011 |

OTHER PUBLICATIONS

Korean Office Action dated Sep. 20, 2018 in corresponding Korean Patent Application No. 10-2016-0081510.

* cited by examiner

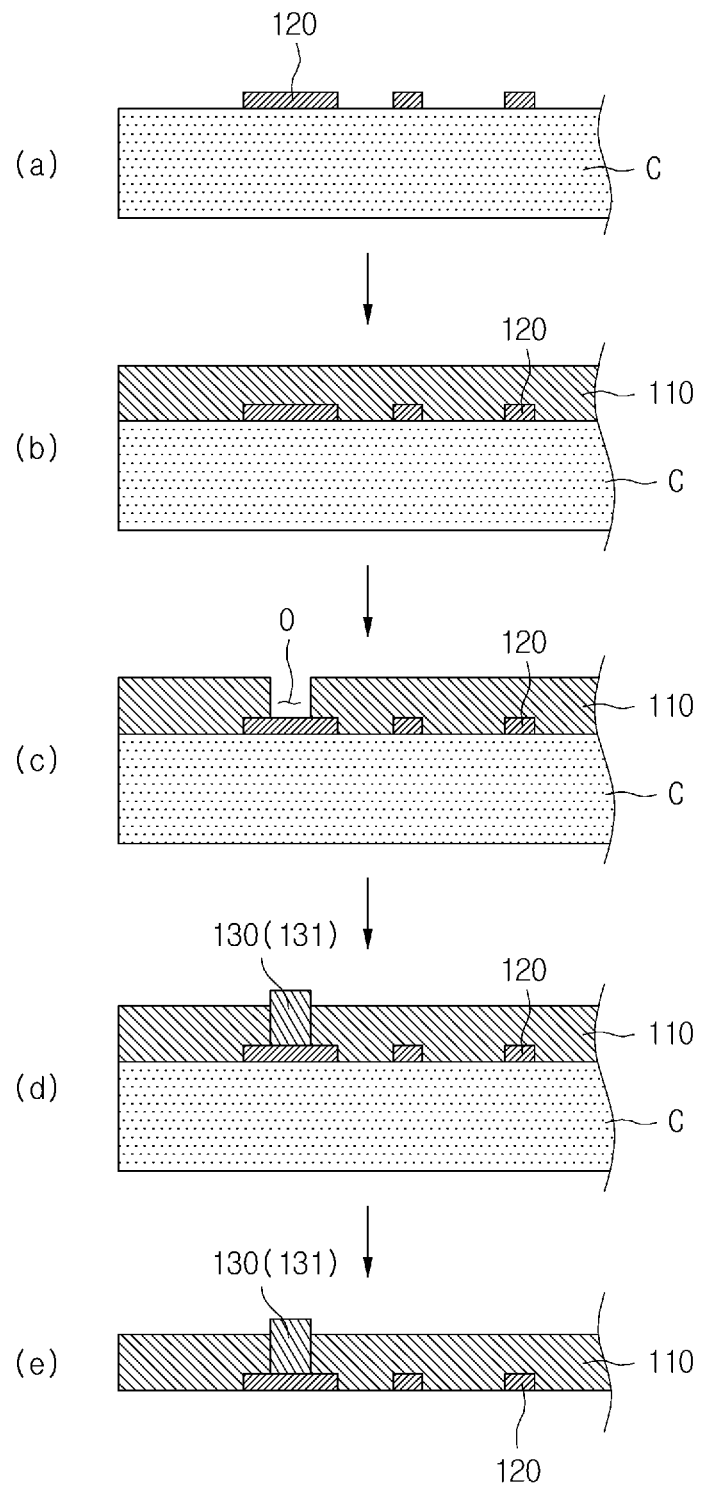

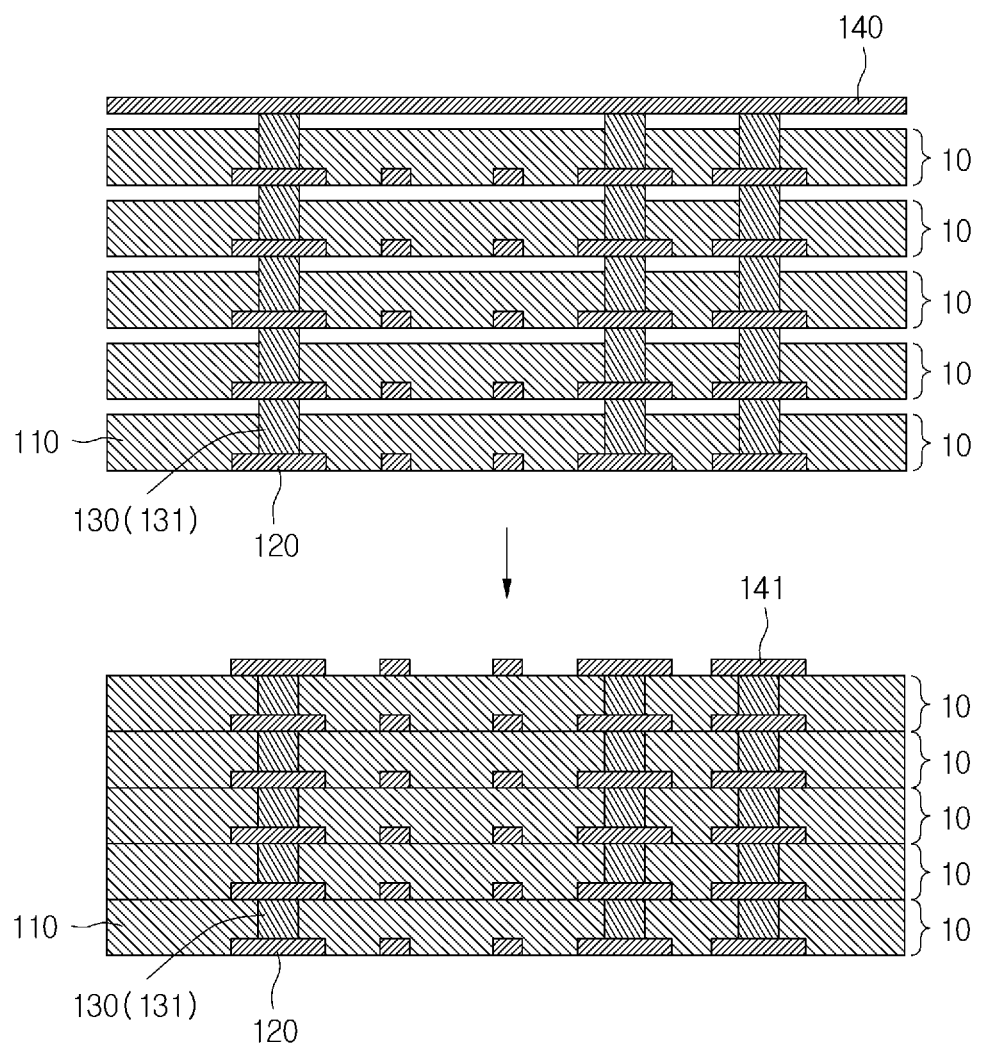

FIG. 13
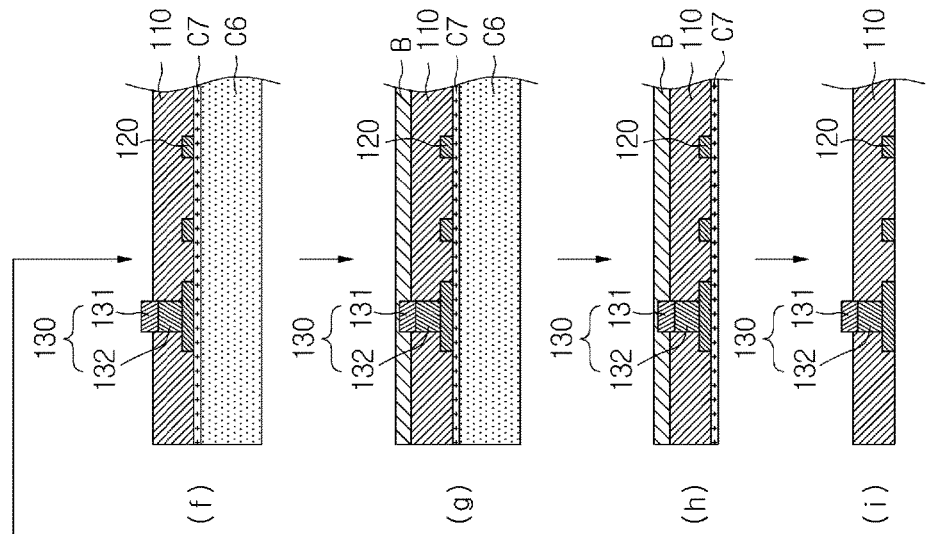
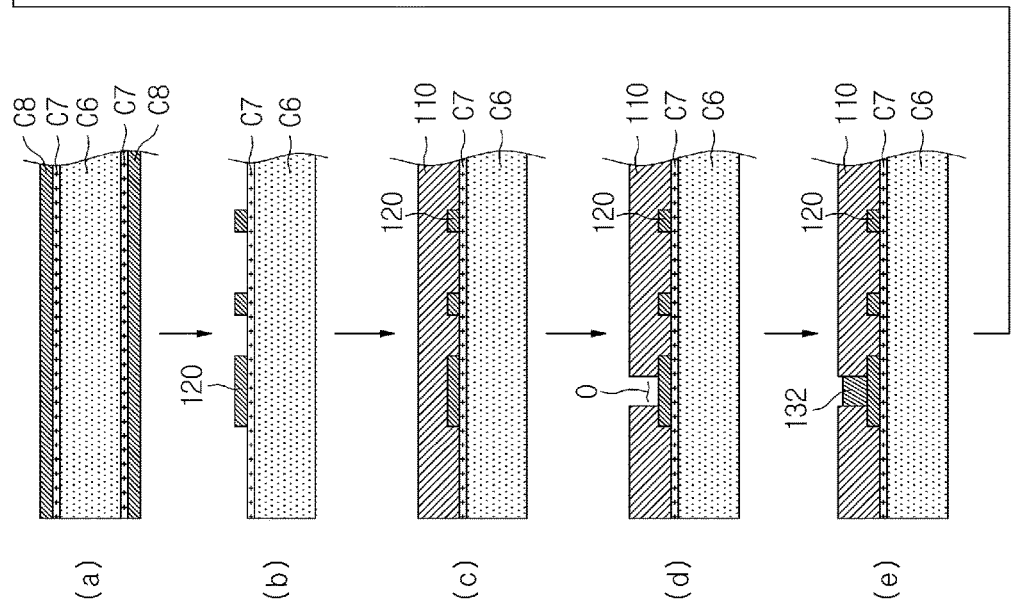

MULTILAYERED SUBSTRATE AND METHOD FOR MANUFACTURING THE SAME

CROSS-REFERENCE TO RELATED APPLICATIONS

This application is a continuation-in-part of application Ser. No. 15/196,857 filed on Jun. 29, 2016, which claims the benefit under 35 USC 119(a) of Korean Patent Application Nos. 10-2015-0092257, 10-2016-0041222 and 10-2016-0081510, filed with the Korean Intellectual Property Office on Jun. 29, 2015, Apr. 4, 2016 and Jun. 29, 2016, respectively, the disclosures of which are incorporated herein by reference in their entirety.

BACKGROUND

1. Field

The following description relates to a multilayered substrate and a method of manufacturing the multilayered substrate.

2. Description of Related Art

When a multilayered substrate is manufactured, a plurality of build-up layers are successively laminated on a core substrate. Accordingly, the number of laminating processes is increased in proportion to the number of layers of the multilayered substrate. During the laminating processes, heat is also applied to portions that are already laminated, possibly causing an unnecessary, unpredictable deformation. If this deformation were increased, the difficulty of inter-layer alignment would be escalated.

The related art is described in Korean Patent Publication No. 10-2011-0066044 (laid open on Jun. 16, 2011).

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The present disclosure provides a multilayered substrate with an improved alignment, an inductor including the multilayered substrate and a method of manufacturing the multilayered substrate.

According to an aspect of the present disclosure, a method of manufacturing a multilayered substrate may include: forming a plurality of unit substrate; and laminating the plurality of unit substrates en bloc, wherein the forming of each of the plurality of unit substrates may include: forming a conductive pattern on a carrier; laminating a photosensitive insulating layer on the carrier so as to cover the conductive pattern; forming a bump being connected with the conductive pattern by penetrating the photosensitive insulating layer; and removing the carrier. The bump may include a low melting point metal layer and a high melting point metal layer, wherein the low melting point metal layer may have a melting point lower than a melting point of the conductive pattern, and the high melting point metal layer may have a melting point higher than the melting point of the low melting point metal layer.

The forming of the bump may include: forming an opening corresponding to the bump on the photosensitive insulating layer; forming the high melting point metal layer inside the opening; and forming the low melting point metal layer on the high melting point metal layer.

The carrier may include a resin layer, a first metal foil formed on the resin layer and a second metal foil formed on the first metal foil. The conductive pattern may be formed by etching the second metal foil. The removing of the carrier may include removing the resin layer and removing, by etching, the first metal foil.

The first metal foil and the second metal foil may be each made of a material different from each other, and the first metal foil and the second metal foil may be each etched by an etchant different from each other.

According to another aspect of the present disclosure, a multilayered substrate may include an insulating layer, a conductive pattern embedded, at least partially, in the insulating layer, and a bump being electrically connected to the conductive pattern and penetrating the insulating layer. The bump may include a low melting point metal layer having a melting point lower than a melting point of the conductive pattern and a high melting point metal layer having a melting point higher than the melting point of the low melting point metal layer and having a latitudinal cross-sectional area smaller than a latitudinal cross-sectional area of the low melting point metal layer.

Other features and aspects will be apparent from the following detailed description, the drawings, and the claims.

BRIEF DESCRIPTION OF DRAWINGS

FIG. 9 illustrates processes of forming one of unit substrates, as listed in the flow diagram shown in FIG. 8, by showing a cross-section of the unit substrate.

FIG. 11 illustrates processes of laminating unit substrates en bloc, as listed in the flow diagram shown in FIG. 8, by showing cross-sections of the unit substrates.

FIG. 13 illustrates processes of forming one of unit substrates, as listed in the flow diagram shown in FIG. 12, by showing a cross-section of the unit substrate.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
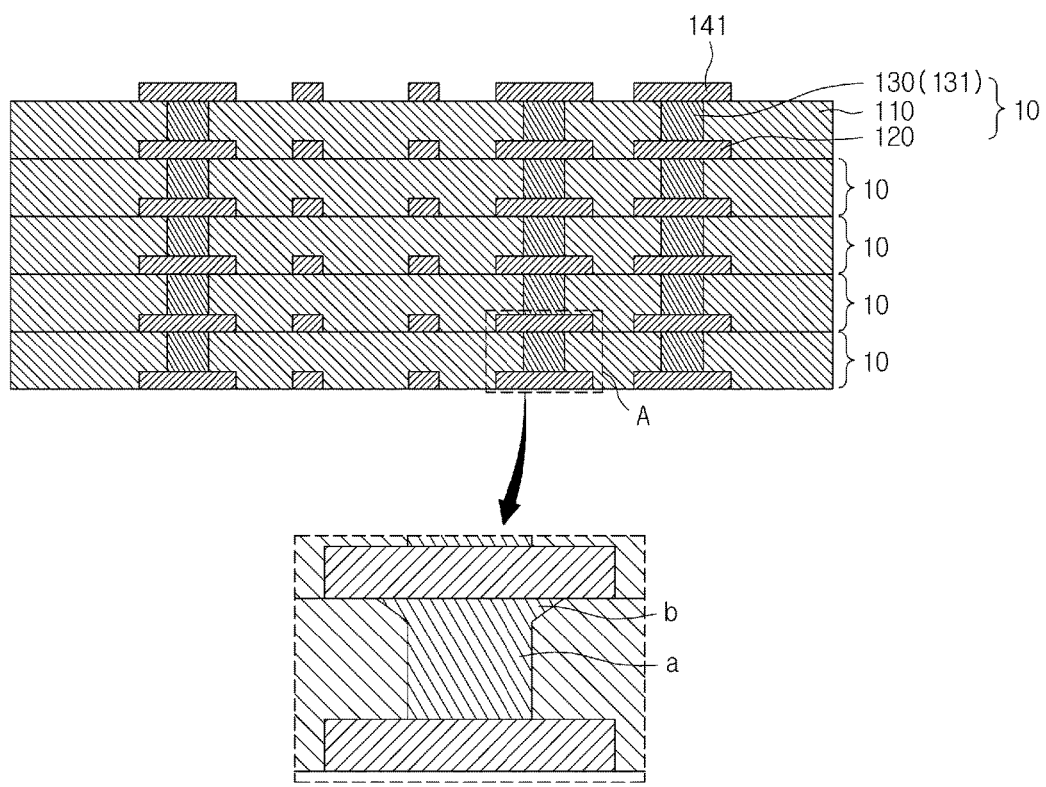
FIG. 1 illustrates a multilayered substrate in accordance with a first embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Unless otherwise defined, all terms, including technical terms and scientific terms, used herein have the same meaning as how they are generally understood by those of ordinary skill in the art to which the present disclosure pertains. Any term that is defined in a general dictionary shall be construed to have the same meaning in the context of the relevant art, and, unless otherwise defined explicitly, shall not be interpreted to have an idealistic or excessively formalistic meaning.

Identical or corresponding elements will be given the same reference numerals, regardless of the figure number, and any redundant description of the identical or corresponding elements will not be repeated. Throughout the description of the present disclosure, when describing a certain relevant conventional technology is determined to evade the point of the present disclosure, the pertinent detailed description will be omitted. Terms such as "first" and "second" can be used in describing various elements, but the above elements shall not be restricted to the above terms. The above terms are used only to distinguish one element from the other. In the accompanying drawings, some elements may be exaggerated, omitted or briefly illustrated, and the dimensions of the elements do not necessarily reflect the actual dimensions of these elements.

Hereinafter, certain embodiments of the present disclosure will be described in detail with reference to the accompanying drawings.

Multilayered Substrate

First Embodiment

FIG. 1 illustrates a multilayered substrate in accordance with a first embodiment.

Referring to FIG. 1, a multilayered substrate 100 in accordance with a first embodiment includes a plurality of unit substrates 10 laminated in a direction of thickness thereof.

The plurality of unit substrates 10 each include an insulating layer 110, a conductive pattern 120 and a bump 130.

The insulating layer 110 may be a photosensitive insulating layer made of a material reacting to light and may include a photo-curable resin.

Hereinafter, for the purpose of description, the insulating layer 110 will be referred to as photosensitive insulating layer, this shall by no means exclude the possibility of the insulating layer 110 being formed as thermosetting resin, which is non-photosensitive resin. Hardness of the photosensitive insulating layer 110 may be adjusted by light. Nonetheless, it is also possible that the photosensitive insulating layer 110 has a thermosetting property and thus the hardness thereof is adjusted by heat.

For the photosensitive insulating layer 110, it is possible to undertake photolithography processes, i.e., exposure and development processes, without requiring photo resist. It is more advantageous for realizing a fine hole when a hole is processed using a photo process in the photosensitive insulating layer 110 than when a hole is processed using a laser in a non-photosensitive insulating layer, such as prepreg. Moreover, while a plurality of laser processes are required to form a plurality of holes using a laser, only a single process is required if the photolithography process is used, thereby simplifying the manufacturing process.

Moreover, compared to the laser process, a greater variety of hole shapes may be formed by the photolithography processes. For example, the hole may be formed in various shapes, such as a trapezoidal shape, an inverse trapezoidal shape, a rectangular shape, etc.

The photosensitive insulating layer 110 may be a positive type or a negative type.

If the photosensitive insulating layer 110 is the positive type, photopolymer coupling is broken at a portion where light is received, during the exposure process. Afterwards, through the development process, the portion at which the photopolymer coupling is broken by receiving the light is removed.

If the photosensitive insulating layer 110 is the negative type, photopolymerization is occurred at a portion where light is received, during the exposure process, transforming a single structure to a three-dimensional network structure. By carrying out the development process, a portion where the light is not received is removed.

Meanwhile, the photosensitive insulating layer 110 may have an inorganic filler contained in the photo-curable resin. The inorganic filler enhances a rigidity of the photosensitive insulating layer 110.

Used for the inorganic filler may be at least one selected from the group consisting of silica ($SiO_2$), alumina ($Al_2O_3$), silicon carbide (SiC), barium sulfate ($BaSO_4$), talc, clay, mica powder, aluminum hydroxide ($AlOH_3$), magnesium hydroxide ($Mg(OH)_2$), calcium carbonate ($CaCO_3$), magnesium carbonate ($MgCO_3$), magnesium oxide (MgO), boron nitride (BN), aluminum borate ($AlBO_3$), barium titanate ($BaTiO_3$) and calcium zirconate ($CaZrO_3$).

The conductive pattern 120 may include at least one of circuit pattern, power pattern and ground pattern. In the case where the conductive pattern 120 is the circuit pattern, the conductive pattern 120 may transfer signals along a plane of a layer of the multilayered substrate 100.

The conductive pattern 120 may be embedded in the photosensitive insulating layer 110. The conductive pattern 120 may be installed in one surface of the photosensitive insulating layer 110. Specifically, the conductive pattern 120 may be leant toward a lower side of the photosensitive insulating layer 110 in such a way that one surface of the conductive pattern 120 is exposed from the photosensitive insulating layer 110.

In this example, the orientations of being "upper" and "lower" may be based on taking any one side of the unit substrate as an "upper" side and the other side thereof as a "lower" side, and may not refer to orientations of absolute upper and lower positions.

The conductive pattern 120 may be formed using, but not limited to, at least one of various processes such as, for example, an additive process, a subtractive process, a semi-additive process, a tenting process and a modified semi-additive process.

The conductive pattern 120 may be made of copper (Cu), silver (Ag), palladium (Pd), aluminum (Al), nickel (Ni), titanium (Ti), gold (Au) or platinum (Pt), which has excellent electrical properties.

The conductive pattern 120 may be formed on each of the plurality of unit substrates 10. The shapes of the conductive patterns 120 formed on the plurality of unit substrates 10 may be identical with one another or different from one another.

The bump 130 may penetrate the photosensitive insulating layer 110 in order to provide an interlayer electrical connection between conductive patterns 120 formed at different photosensitive insulating layers, respectively. In other words, the bump 130 is formed inside the photosensitive insulating layer 110 and is in contact with the conductive patterns 120 for interlayer connection of the conductive patterns 120.

In the case where the conductive pattern 120 is leant toward the lower side of the photosensitive insulating layer 110 in such a way that the one surface of the conductive pattern 120 is exposed from the photosensitive insulating layer 110, the bump 130 may be formed on an upper surface of the conductive pattern 120. In this example, the one surface of the conductive pattern 120 may be exposed through one surface of the photosensitive insulating layer 110, and one surface of the bump 130 may be exposed through the other surface of the photosensitive insulating layer 110.

When the plurality of unit substrates 10 are laminated en bloc, the bump 130 may allow the conductive patterns 120 formed on different unit substrates to join with one another. In the present description, laminating en bloc refers to arranging a plurality of objects separated from one another above and below each other and then laminating the plurality of objects with one another by heating and pressing the plurality of arranged objects. The plurality of objects may include the unit substrates 10, and may include first metal layer 140, second metal layer 160 and insulating material 150.

The bump 130 may include low melting point metal layer 131. In this example, the low melting point metal layer 131 may refer to a layer made of a metal having a melting point lower than a melting point of the conductive pattern 120. The low melting point metal layer 131 may be melted during the en bloc lamination and then coupled with the conductive pattern 120 after the en bloc lamination.

The low melting point metal layer 131 of the bump 130 may be made of a solder material. As illustrated in FIG. 1, the bump 130 may be entirely made of the low melting point metal layer 131, and thus the bump 130 may be entirely made of the solder material.

In this example, "solder" refers to a metallic material that may be used for soldering. The solder may be an alloy containing lead (Pb), but it is also possible that the solder does not contain lead. For instance, the solder may be tin (Sn), silver (Ag), copper (Cu) or an alloy of metals selected from tin (Sn), silver (Ag) and copper (Cu). Specifically, the solder used in an embodiment may be an alloy of tin, silver and copper with a tin content of 90% or more.

With a plurality of photosensitive insulating layers 110, the bumps 130 formed on the plurality of photosensitive insulating layers 110, respectively, may be aligned in a straight line through the entire layers. In other words, the bumps 130 may form a stacked structure through the entire layers. In this example, as illustrated in FIG. 1, the stacked structure through the entire layers may refer to the bumps 130 being formed, respectively, on the plurality of the unit substrates 10 and these bumps 130 forming the straight line. However, it does not mean that centerlines of these bumps 130 are vertically aligned, and the centerlines of these bumps 130 may be misaligned as long as these bumps 130 overlap at least partially with each other vertically.

The bumps 130 may each have the shape of a column Owing to this shape, the bump 130 may be referred to as a "post" or a "pillar."

The column shape of the bump 130 may have a constant latitudinal cross section from a top to a bottom thereof. In this example, being "constant" does not necessarily mean being exactly identical but may mean being substantially identical within a tolerable range of error.

Moreover, the column shape of the bump 130 may not have a constant latitudinal cross section from the top to the bottom thereof. For example, a longitudinal cross section of the bump 130 may have the shape of a trapezoid or an inverse trapezoid.

As illustrated in portion marked with "A" in FIG. 1, the bump 130 may include column shape region a, having a constant latitudinal cross section from a top to a bottom thereof, and column shape region b, having a greater latitudinal cross-sectional area than a latitudinal cross-sectional area of the column shape region a. Specifically, the bump 130 may be successively formed with the column shape region a, of which the latitudinal cross-sectional area is constant from the upper surface of the conductive pattern 120 to the other surface of the photosensitive insulating layer 110, and the column shape region b, of which the latitudinal cross-sectional area is greater than the latitudinal cross-sectional area of the column shape region a. A thickness of the column shape region b may be significantly smaller than a thickness of the column shape region a.

However, it is preferable that a lateral boundary of the column shape region b is within a range of the conductive pattern 120.

The column shape region b may be resulted from an upper portion of the low melting point metal layer 131 being pressed and being spread to the photosensitive insulating layer 110 when the plurality of unit substrates 10 are laminated en bloc. By the region b of the bump 130, an area joined between the bump 130 and the conductive pattern 120 may be increased.

Even if the bump 130 has the column shape of which the latitudinal cross section is different between the top and the bottom thereof, rather than being constant from the top to the bottom thereof, the top thereof may have the greatest latitudinal cross-sectional area, as described above.

The shape of the bump 130 illustrated in the portion marked with "A" in FIG. 1 is merely one example, and the region b, which is spread to the photosensitive insulating area 110 when the upper portion of the bump 130 is pressed may have a shape different from what is illustrated in the portion "A" in FIG. 1. For example, a portion of the longitudinal cross section of the region b that corresponds to the boundary thereof with the photosensitive insulating layer 110 may be a curve of which curvature increases from top to bottom thereof. In another example, the portion of the longitudinal cross section of the region b that corresponds to the boundary thereof with the photosensitive insulating layer 110 may be a curve of which curvature increases from bottom to top thereof. In yet another example, the portion of the longitudinal cross section of the region b that corresponds to the boundary thereof with the photosensitive insulating layer 110 may be a curve of which curvature changes irregularly from bottom to top thereof.

Moreover, as illustrated in FIG. 1, the multilayered substrate 100 in accordance with the first embodiment may further include a first metal pattern 141.

The first metal pattern 141 may be a pattern made of a metallic material that is formed above the unit substrate 10 positioned at an uppermost layer of the plurality of unit substrates 10. The first metal pattern 141 may be functionally similar or identical with the conductive pattern 120 described above, but the term "metal pattern" is used herein in order to distinguish the first metal pattern 141 from the conductive patterns 120 buried within the photosensitive insulating layers 110.

Unlike the conductive pattern 120 being buried in the photosensitive insulating layer 110, the first metal pattern 141 may be protruded from one of outermost layers, particularly from the photosensitive insulating layer 110.

The first metal pattern 141 may be electrically connected with the bump 130 and may be in contact with the bump 130.

Like the conductive pattern 120, the first metal pattern 141 may be formed using, but not limited to, at least one of various processes such as, for example, an additive process, a subtractive process, a semi-additive process, a tenting process and a modified semi-additive process.

The first metal pattern 141 may be made of copper (Cu), silver (Ag), palladium (Pd), aluminum (Al), nickel (Ni), titanium (Ti), gold (Au) or platinum (Pt). Moreover, the first metal pattern 141 may be made of the same type of metal of the conductive pattern 120.

Second Embodiment

Figure 2:
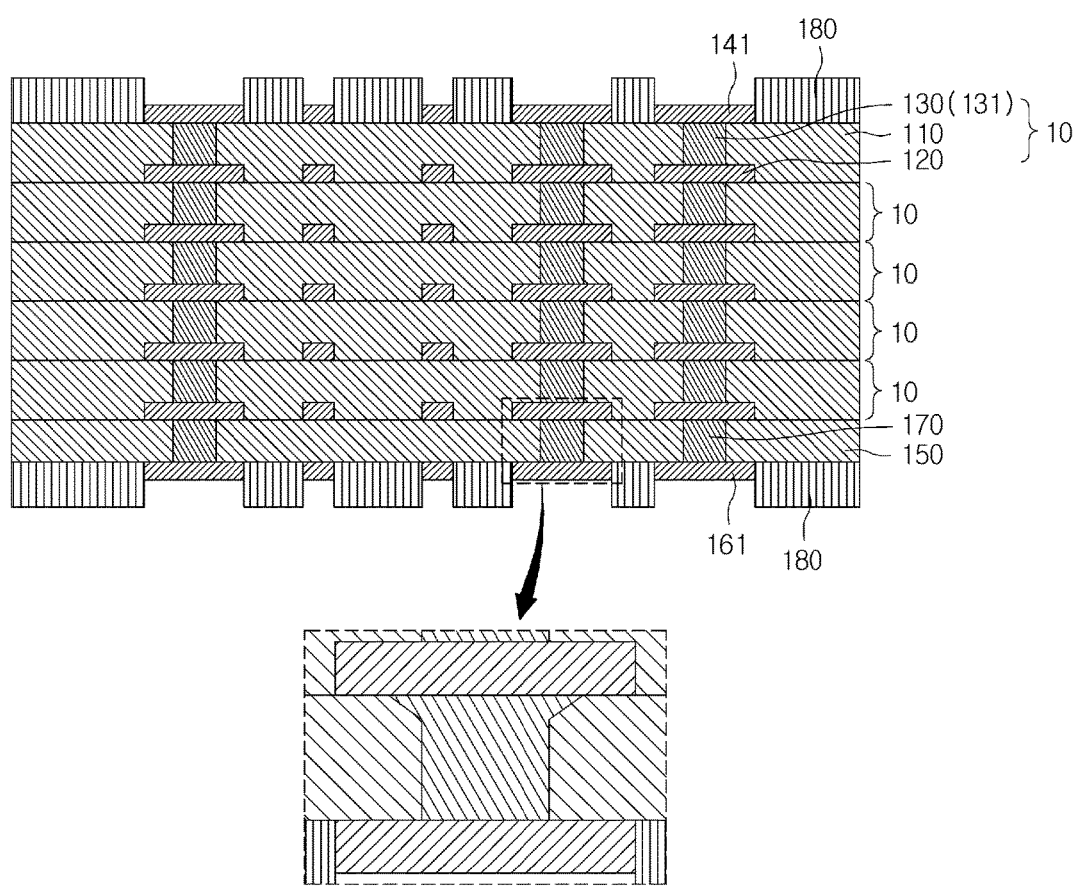
FIG. 2 illustrates a multilayered substrate in accordance with a second embodiment.

FIG. 2 illustrates a multilayered substrate in accordance with a second embodiment.

Referring to FIG. 2, a multilayered substrate 100 in accordance with a second embodiment includes a plurality of unit substrates 10 laminated in a direction of thickness thereof.

The plurality of unit substrates 10 may each include a photosensitive insulating layer 110, a conductive pattern 120 and a bump 130.

As described earlier, the photosensitive insulating layer 110 is an insulating layer having a photosensitive property, and the conductive pattern 120 is formed within the photosensitive insulating layer 110. The bump 130 penetrates the photosensitive insulating layer 110 in order to provide an interlayer electrical connection between conductive patterns 120 formed at different layers, respectively. Moreover, the bump 130 includes a low melting point metal layer 131.

The multilayered substrate 100 in accordance with the second embodiment may further include a first metal pattern 141, an insulating material 150, a second metal pattern 161, a via 170 and a solder resist 180.

The first metal pattern 141 is identical with what has been described above with reference to FIG. 1.

The insulating material 150 is a resin layer formed below a unit substrate that is placed at a lowermost layer among the plurality of unit substrates 10. In the multilayered substrate 100 in accordance with the second embodiment, the insulating material 150 may include a photosensitive resin. In other words, the insulating material 150 may include a photo-curable resin made of a same material as that of the photosensitive insulating layer 110. Meanwhile, the photosensitive property has been described above and thus will not be described redundantly herein.

The insulating material 150 may have a same thickness as that of the photosensitive insulating layer 110. However, the insulating material 150 may not have the conductive pattern 120 installed therein and may have the second metal pattern 161 protruded therefrom.

That is, in the multilayered substrate 100 in accordance with the second embodiment, the conductive pattern 120 is installed in each photosensitive insulating layer 110, and the first metal pattern 141 is protruded from the photosensitive insulating layer 110 disposed at an uppermost position, and the second metal pattern 161 is protruded from the first insulating material 150.

As described earlier, the second metal pattern 161 is a pattern made of a metallic material that is formed on a lower surface of the insulating material 150 such that the second metal pattern 161 is protruded from the insulating material 150.

Like the first metal pattern 141, the second metal pattern 161 may be formed using, but not limited to, at least one of various processes such as, for example, an additive process, a subtractive process, a semi-additive process, a tenting process and a modified semi-additive process.

Moreover, the second metal pattern 161 may be made of copper (Cu), silver (Ag), palladium (Pd), aluminum (Al), nickel (Ni), titanium (Ti), gold (Au) or platinum (Pt). The second metal pattern 161 may be made of the same material as that of the first metal pattern 131.

The via 170 may be formed to penetrate the insulating material 150 so as to be connected with the second metal pattern 161. The via 170 may be formed on the second metal pattern 161. The via 170 may be formed in a shape identical with that of the bump 130 described above. That is, like the bump 130, the via 170 may have the column shape of which the latitudinal cross section is constant from top to bottom thereof. Alternatively, the via 170 may have the column shape of which the latitudinal cross section is not constant.

Moreover, the via 170 may be made of the same material as that of the bump 130. That is, the via 170 may include includes the low melting point metal layer 131 and may be entirely constituted with the low melting point metal layer 131 made of a solder material. As described earlier, the solder may be an alloy containing lead (Pb), but the solder may possibly be tin (Sn), silver (Ag), copper (Cu) or an alloy of metals selected from tin (Sn), silver (Ag) and copper (Cu), without lead (Pb).

The solder resist 180 may be formed on the photosensitive insulating layer 110 disposed at an uppermost layer so as to cover the first metal pattern 11, and on the insulating material 150 so as to cover the second metal pattern 161.

After the solder resist 180 is coated to cover the first metal pattern 141 and the second metal pattern 161 entirely, portions of the solder resist 180 are removed to prepare the first metal pattern 141 and the second metal pattern 161 to function as pads. The first metal pattern 141 and the second metal pattern 161 exposed by removing the portions fo the solder resist 180 may function as pads and become a position at which an external device is connected.

That is, a connector, such as a solder ball, is formed at exposed portions of the first metal pattern 141 and the second metal pattern 161 to allow the multilayered substrate 100 to be electrically connected with an external device such as an electronic component and/or a mainboard.

In the case where the solder resist 180 has a photosensitive property, a photolithography process may be used while exposing the portions of the first metal pattern 141 and the second metal pattern 161.

Third Embodiment

Figure 3:
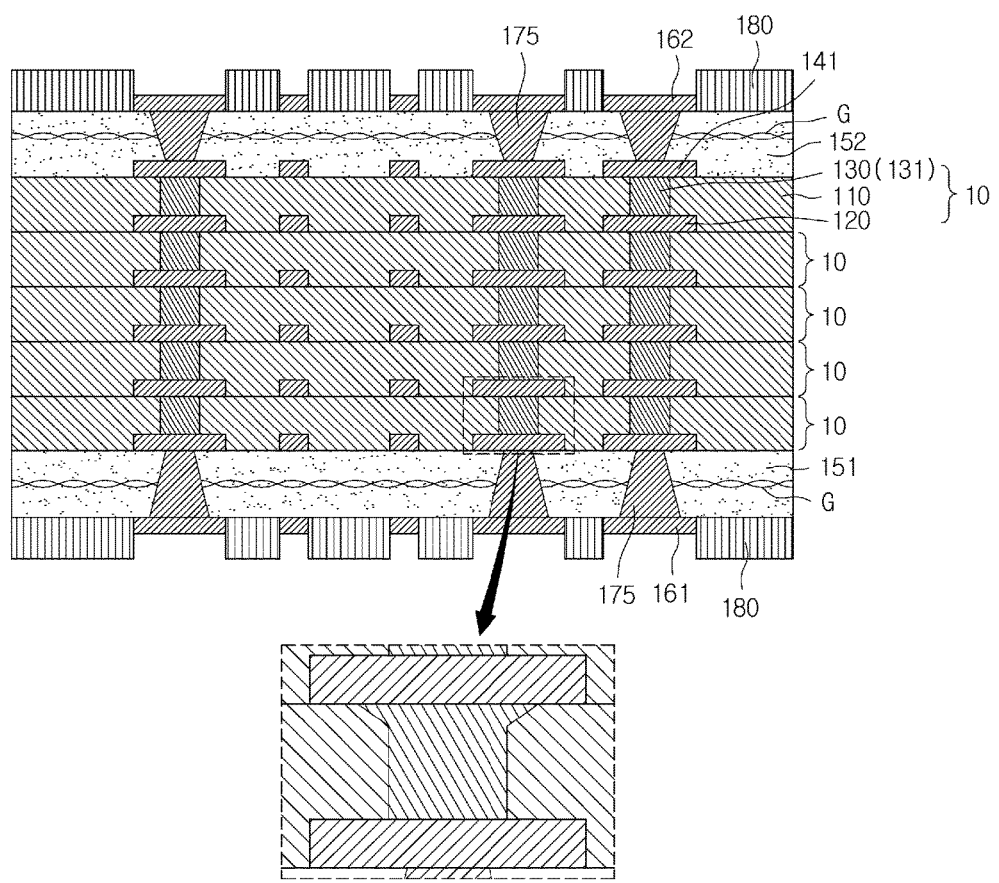
FIG. 3 illustrates a multilayered substrate in accordance with a third embodiment.

FIG. 3 illustrates a multilayered substrate in accordance with a third embodiment.

Referring to FIG. 3, a multilayered substrate 100 in accordance with a third embodiment may include a plurality of unit substrates 10 laminated in a direction of thickness thereof.

The plurality of unit substrates 10 may each include a photosensitive insulating layer 110, a conductive pattern 120 and a bump 130. Moreover, the multilayered substrate 100 in accordance with the third embodiment may further include a first metal pattern 141, a first insulating material 151, a second insulating material 152, a second metal pattern 161, a third metal pattern 162, a via 175 and a solder resist 180.

The first metal pattern 141 is identical with what has been described above with reference to FIG. 1.

In the multilayered substrate 100 in accordance with the third embodiment, the first insulating material 151 may be mainly made of a resin and formed below a unit substrate that is placed at a lowermost layer among the plurality of unit substrates 10. The first insulating material 151 may be thicker than a single photosensitive insulating layer 110.

The second insulating material 152 may be mainly made of a resin and formed above a unit substrate that is placed at an uppermost layer among the plurality of unit substrates 10. That is, the second insulating material 152 may be formed on the first metal pattern 141.

Accordingly, in the multilayered substrate 100 in accordance with the third embodiment, the first insulating material 151 and the second insulating material 152 may be laminated, respectively, on outermost layers of the plurality of the unit substrates 10.

The first insulating material 151 and the second insulating material 152 may include thermosetting resin such as epoxy resin, thermoplastic resin such as polyimide, or photocurable resin.

The epoxy resin may be, but not limited to, for example, naphthalene epoxy resin, bisphenol A type epoxy resin, bisphenol F type epoxy resin, novolak epoxy resin, cresol novolak epoxy resin, rubber modified epoxy resin, ring-type aliphatic epoxy resin, silicon epoxy resin, nitrogen epoxy resin or phosphor epoxy resin.

The first insulating material 151 and/or the second insulating material 152 may each include a stiffener G impregnated. That is, the first insulating material 151 and/or the second insulating material 152 may be insulating resin in which the stiffener G is impregnated. The stiffener G may be fiber stiffener. The fiber stiffener may be fiberglass, which may be distinguished into glass filament, glass fiber and glass fabric, depending on a thickness thereof. In this example, any one of glass filament, glass fiber and glass fabric may be used as the stiffener G.

In the meantime, epoxy resin having such fiberglass impregnated therein as the stiffener G may be referred to as prepreg (PPG), and the first and second insulating materials 151, 152 may be prepreg (PPG).

The first insulating material 151 and the second insulating material 152 made of resin having the stiffener G impregnated therein may improve the rigidity of the multilayered substrate 100.

The second metal pattern 161 is a pattern made of a metallic material that is formed on a lower surface of the first insulating material 151, which is formed below the unit substrate at the lowermost layer among the plurality of unit substrates 10. The second metal pattern 161 has been described earlier with reference to FIG. 2.

The third metal pattern 162 is a pattern made of a metallic material that is formed on an upper surface of the second insulating material 152, which is formed above the unit substrate at the uppermost layer among the plurality of unit substrates 10.

Like the first metal pattern 141 and the second metal pattern 161, the third metal pattern 162 may be formed using, but not limited to, at least one of various processes such as, for example, an additive process, a subtractive process, a semi-additive process, a tenting process and a modified semi-additive process.

Moreover, the third metal pattern 162 may be made of copper (Cu), silver (Ag), palladium (Pd), aluminum (Al), nickel (Ni), titanium (Ti), gold (Au) or platinum (Pt).

The first metal pattern 141 is covered by the first insulating material 151 and thus is not exposed to an outside. However, the second metal pattern 161 and the third metal pattern 162 are formed on an outside surface of the first insulating material 151 and the second insulating material 152, respectively, and thus are exposed from the insulating materials 151, 152.

The via 175 is formed by penetrating the first insulating material 151 so as to connect the second metal pattern 161 with the conductive pattern 120 or by penetrating the second insulating material 152 so as to connect the first metal pattern 141 with the third metal pattern 162.

The via 175 may be fabricated by forming a via hole in the first insulating material 151 and the second insulating material 152 and then having a conductive material formed within the via hole. The via hole may be machined using a laser drill and filled with a plating material such as, for example, copper. If necessary, the conductive material may be formed on an inner wall of the via hole only, leaving a portion of the via hole void.

The via 175 may shaped in such a way that a width and a latitudinal cross-sectional area thereof are increased from an inside to an outside of the multilayered substrate 100, in which case the longitudinal cross section of the via 175 may have the shape of a trapezoid.

The solder resist 180 is formed on an outside surface of the first insulating material 151 and on an outside surface of the second insulating material 152, and is formed on the second metal pattern 161 and on the third metal pattern 162.

After the solder resist 180 is coated to cover the second metal pattern 161 and the third metal pattern 162 entirely, portions of the solder resist 180 are removed to prepare the second metal pattern 161 and the third metal pattern 162 to function as pads.

That is, a connector, such as a solder ball, is formed at exposed portions of the second metal pattern 161 and the third metal pattern 162 to allow the multilayered substrate 100 to be electrically connected with an external device such as an electronic component and/or a mainboard.

In the case where the solder resist 180 has a photosensitive property, a photolithography process may be used while exposing the portions of the second metal pattern 161 and the third metal pattern 162.

Fourth Embodiment

Figure 4:
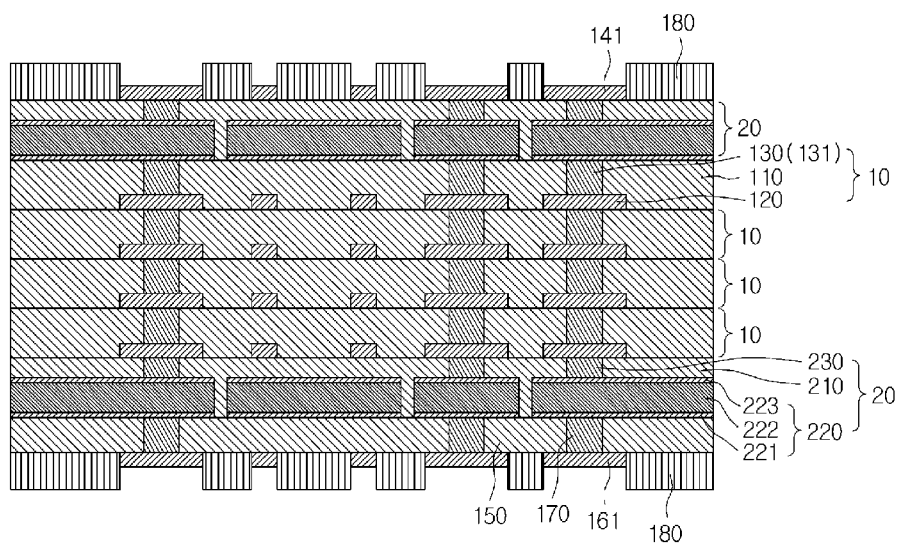
FIG. 4 illustrates a multilayered substrate in accordance with a fourth embodiment.

FIG. 4 illustrates a multilayered substrate in accordance with a fourth embodiment.

Referring to FIG. 4, a multilayered substrate 100 in accordance with a fourth embodiment may include a plurality of unit substrates 10, 20 laminated in a direction of thickness thereof, whereas the plurality of unit substrates 10, 20 are formed with general unit substrate 10 and metal unit substrate 20.

The general unit substrate 10 used in this example corresponds to the unit substrate (reference numeral 10 in FIG. 10) described above with reference to first to third embodiments, and may include a photosensitive insulating layer 110, a conductive pattern 120 and a bump 130.

The metal unit substrate 20 used in this example may include a photosensitive insulating layer 210, a conductive pattern 220 and a bump 230.

The multilayered substrate 100 in accordance with the present embodiment may further include first metal pattern 141, insulating material 150, second metal pattern 161, via 170 and solder resist 180. The first metal pattern 141, the insulating material 150, the second metal pattern 161, the via 170 and the solder resist 180 have been described above with reference to FIG. 2.

Meanwhile, the photosensitive insulating layer 210 and the bump 230 of the metal unit substrate 20 may be formed of the same material and structure as the photosensitive insulating layer 110 and the bump 130 of the general unit substrate 10, respectively, and thus the above description of the photosensitive insulating layer 110 and the bump 130 shall be applied to the photosensitive insulating layer 210 and the bump 230.

Like the conductive pattern 120 of the general unit substrate 10, the conductive pattern 220 of the metal unit substrate 20 is formed to be embedded in one surface of the photosensitive insulating layer 210.

The conductive pattern 220 of the metal unit substrate 20 is constituted with a plurality of conductive layers made of different conductive materials from one another. That is, as illustrated in FIG. 4, the conductive pattern 220 of the metal unit substrate 20 may be formed with first conductive layer 221, second conductive layer 222 formed on the first conductive layer 221, and third conductive layer 223 formed on the second conductive layer 222.

In the present embodiment, multi-metal plate, which is formed by forming copper layers on either surface of an Invar layer, may be used as a raw material for forming the conductive pattern 220 of the metal unit substrate 20, and the conductive pattern 220 of the metal unit substrate 20 may be formed by selectively etching the multi-metal plate 20. Accordingly, the first conductive layer 221 and the third conductive layer 223 may each be made of copper, and the second conductive layer 222, which is interposed between the first conductive layer 221 and the third conductive layer 223 may be made of Invar. Nevertheless, this is merely an example, and it is possible that the first to third conductive layers are made of different metal or alloy. Likewise, the conductive pattern 220 of the metal unit substrate 20 may be a dual layer structure or a quadruple or more layer structure, rather than the triple layer structure.

The conductive pattern 220 of the metal unit substrate 20 may include a metallic material having a greater rigidity than the material constituting the conductive pattern 120 of the general unit substrate 10, and may occupy most of the area where the metal unit substrate 20 is formed, and thus may reinforce the rigidity of the multilayered substrate in accordance with the present embodiment.

Referring to FIG. 4, as the conductive pattern 220 of the metal unit substrate 20 is an element for providing the rigidity, a density of the conductive pattern 220 in the metal unit substrate 20 may be relatively higher than the conductive pattern 120 in the general unit substrate 10. That is, the conductive pattern 220 of the metal unit substrate 20 may be formed most of the area where the metal unit substrate 20 is formed, excluding a portion where electrical opening is required.

The multilayered substrate 100 in accordance with the present embodiment may prevent warpage by laminating the metal unit substrate 20, which has a higher rigidity than the general unit substrate 10, with the general unit substrate 10 en bloc.

Although FIG. 4 illustrates that the metal unit substrate 20 is laminated above and below the structure in which the plurality of general unit substrates 10 are laminated, this is merely an example. In other words, the metal unit substrate 20 may be arranged above an uppermost general unit substrate 10 among the plurality of general unit substrates 10 and laminated en bloc with the plurality of general unit substrates 10, or arranged below a lowermost general unit substrate 10 among the plurality of general unit substrates 10 and laminated en bloc with the plurality of general unit substrates 10. That is, the position and number of metal unit substrates 20 in the multilayered substrate 100 may be varied depending on where and the how much warpage prevention is required in the multilayered substrate 100.

Moreover, although it is illustrated in FIG. 4 that a lateral surface of the conductive pattern 220 of the metal unit substrate 20 is perpendicular to a lower surface of the photosensitive insulating layer 210 of the metal unit substrate 20, this is merely an example, and the lateral surface of the conductive pattern 220 may be formed at various other non-perpendicular angles with the lower surface of the lower surface of the photosensitive insulating layer 210 of the metal unit substrate 20.

Fifth Embodiment and Other Examples

Figure 5:
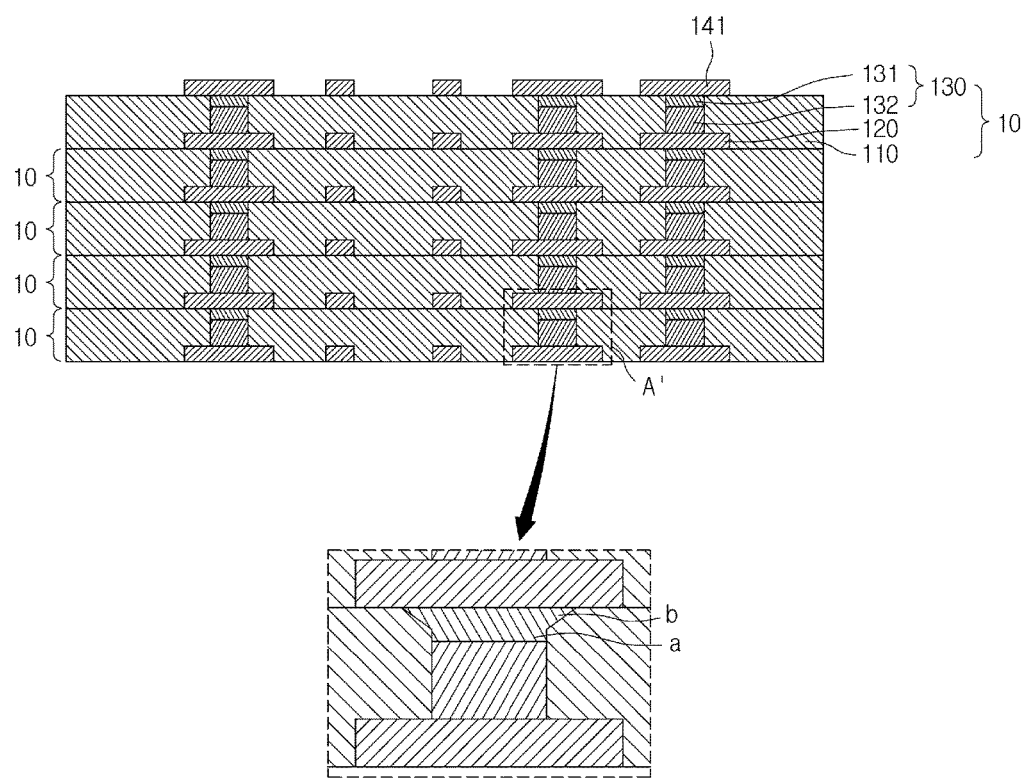
FIG. 5 illustrates a multilayered substrate in accordance with a fifth embodiment.

FIG. 5 illustrates a multilayered substrate in accordance with a fifth embodiment.

Referring to FIG. 5, a multilayered substrate 100 in accordance with a fifth embodiment may include a plurality of unit substrates 10 laminated in a direction of thickness thereof.

The plurality of unit substrates 10 may each include photosensitive insulating layer 110, conductive pattern 120, and bump 130. In the multilayered substrate 100 in accordance with the fifth embodiment, the bump 130 may include low melting point metal layer 131 and high melting point metal layer 132 having a melting point higher than a melting point of the low melting point metal layer 131. The high melting point metal layer 132 may be a metal layer made of a metal having a higher melting point than a melting point of the low melting point metal layer 131. The low melting point metal layer 131 may be formed on the high melting point metal layer 132.

The high melting point metal layer 132 may be a same metal as the conductive pattern 120. For example, the low melting point metal layer 131 may be made of solder material, and the conductive pattern 120 and the high melting point metal layer 132 may be made of copper. In such a case, the bump 130 may have a dual structure of a copper layer and a solder layer.

In the case where the conductive pattern 120 and the high melting point metal layer 132 are made of copper, adhesive between the unit substrates 10 may be increased by increasing adhesion between the conductive pattern 120 and the high melting point metal layer 132 by interposing a solder layer, which is a low melting point metal layer 131, between the conductive pattern 120 and the high melting point metal layer 132 when the plurality of unit substrates 10 are laminated en bloc.

The low melting point metal layer 131 of each unit substrate 10 is pressed and heated during the en bloc lamination, and as illustrated in portion marked with A' in FIG. 5, the low melting point metal layer 131 may be formed with a region a, having a constant latitudinal cross section from a top to a bottom thereof, and region b, having a greater latitudinal cross-sectional area than a latitudinal cross-sectional area of the region a. The region b of the low melting point metal layer 131 having the greater latitudinal cross-sectional area may be resulted from an upper portion of the low melting point metal layer 131 being pressed and being spread to the photosensitive insulating layer 110 during the en bloc lamination.

It is preferable that a lateral boundary of the region b having the greater latitudinal cross-sectional area is within a range of the conductive pattern 120.

The high melting point metal layer 132 of the bump may have a column shape of which a longitudinal cross section is constant from a top to a bottom thereof.

Meanwhile, as illustrated in FIG. 5, the multilayered substrate 100 in accordance with the fifth embodiment may further include first metal pattern 141.

Figure 6:
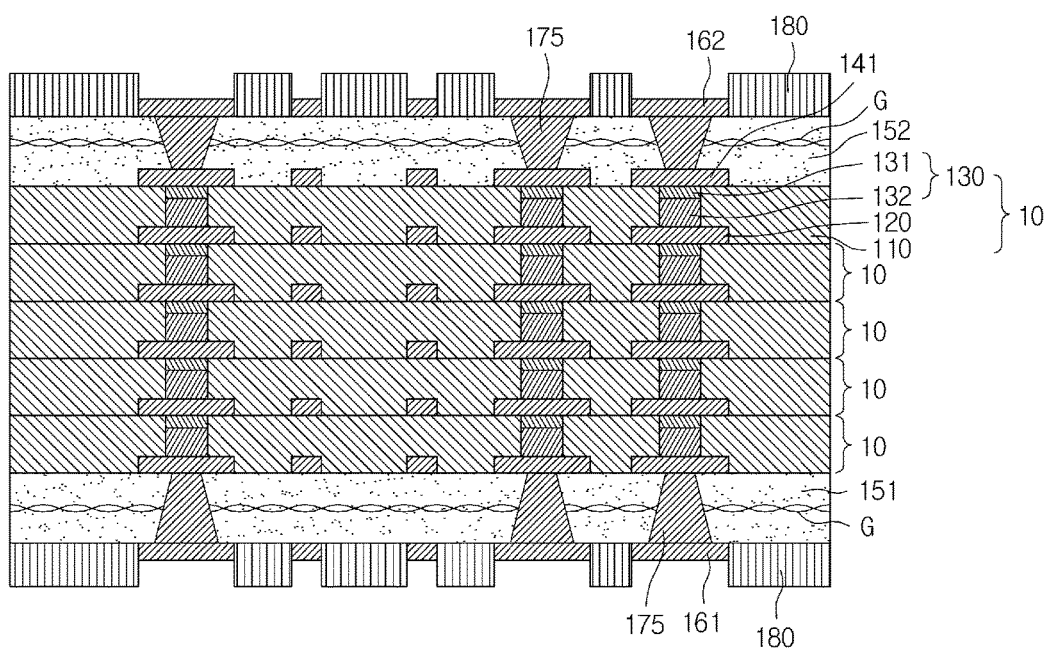
FIG. 6 illustrates a multilayered substrate in accordance with another example of the fifth embodiment.

FIG. 6 illustrates a multilayered substrate in accordance with another example of the fifth embodiment.

Referring to FIG. 6, a multilayered substrate 100 in accordance with another example of the fifth embodiment may include a plurality of unit substrates 10 described above with reference to the fifth embodiment and may further include first insulating material 151, second insulating material 152, second metal pattern 161, third metal pattern 162, solder resist 180 and via 175 described above with reference to FIG. 3.

Figure 7:
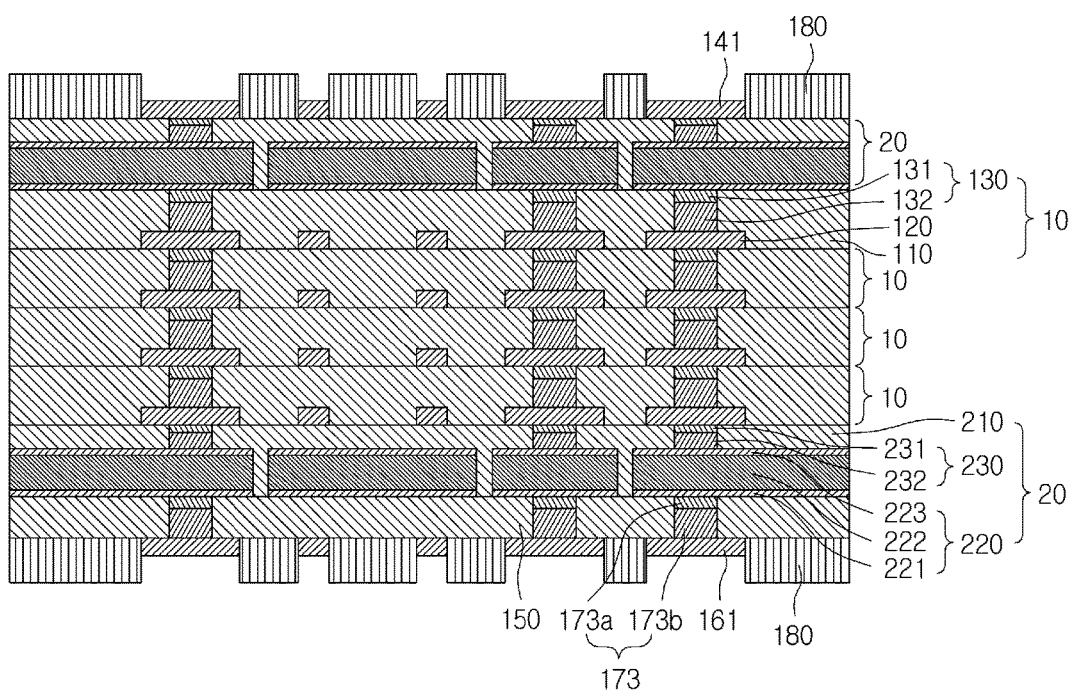
FIG. 7 illustrates a multilayered substrate in accordance with yet another example of the fifth embodiment.

FIG. 7 illustrates a multilayered substrate in accordance with yet another example of the fifth embodiment.

Referring to FIG. 7, a multilayered substrate 100 in accordance with yet another example of the fifth embodiment may include a plurality of unit substrates described above with reference to the fifth embodiment, whereas the plurality of unit substrates are constituted with general unit substrate 10 and metal unit substrate 20 described above with reference to FIG. 4.

However, unlike the bump 130 described above with reference to FIG. 4, in the yet another example of the fifth amendment, the bump 130 formed in the general unit substrate 10 and the bump 230 formed in the metal unit substrate 20 may both include low melting point metal layer and high melting point metal layer. Specifically, the bump 130 formed in the general unit substrate 10 may include low melting point metal layer 131 and high melting point metal layer 132, and the bump 230 formed in the metal unit substrate 20 may include low melting point metal layer 231 and high melting point metal layer 232.

The multilayered substrate 100 in accordance with the yet another example of the fifth embodiment may include insulating material 150, second metal pattern 161 and solder resist 180 described above with reference to FIG. 4. Moreover, the multilayered substrate 100 in accordance with the yet another example of the fifth embodiment may include via 173 penetrating the insulating material 150.

The via 173 may be formed by penetrating the insulating material 150 so as to be connected with the second metal pattern 161. The via 173 may be formed in a same structure as that of the bump 130 used in the fifth embodiment of this disclosure. In other words, like the bump 130 described above with reference to the fifth embodiment, the via 173 may include low melting point metal layer 173a and high melting point metal layer 173b having a higher melting point that a melting point of the low melting point metal layer 173a.

Method of Manufacturing a Multilayered Substrate

FIG. 8 to FIG. 25 illustrate methods of manufacturing a multilayered substrate in accordance with disclosed embodiments. Referring to FIG. 8 to FIG. 25, the methods of manufacturing a multilayered substrate in accordance with the disclosed embodiments may include forming a plurality of unit substrates and laminating the plurality of unit substrates en bloc.

The forming of a plurality of unit substrates 10 may refer to forming a unit substrate multiple times first, and each unit substrate 10 may include photosensitive insulating layer 110, conductive pattern 120 and bump 130.

The conductive patterns 120 formed, respectively, on the plurality of unit substrates 10 may be identical to or different from one another. Even in the case where the conductive patterns 120 are different from one another, a few or several patterns may be repeatedly formed. The bump 130 may include low melting point metal layer 131.

The laminating of the plurality of unit substrates 10 en bloc may refer to laminating at once the entire plurality of unit substrates 10 formed in the above-described step of forming the plurality of unit substrates 10. However, in the step of laminating the plurality of unit substrates 10 en bloc, first metal layer 140 (or first metal layer 140 and second metal layer 160) as well as the plurality of unit substrates 10 may be laminated en bloc.

In the case where the plurality of unit substrates 10 are laminated en bloc, neighboring unit substrates 10 may be pressed to and joined with one another using a laminator, which may be V-press, and the plurality of unit substrates 10 may be vacuum pressed.

The en bloc lamination may be made at a temperature between about 180 and 200 □. In this example, the low melting point metal layer 131 of the bump 130 may be a solder material made of an alloy of tin, silver and copper, with a tin content of 90%, and the above temperature may be above a melting point of solder of the low melting point metal layer 131 of the bump 130, and the unit substrates 10 may be joined with one another as the solder of the low melting point metal layer 131 is melted at the above temperature.

Moreover, in the case where the low melting point metal layer 131 is solder made of tin only, the melting point of tin may be about 230 □, and the temperature for the en bloc lamination may be about 230 □ or higher.

As a result of the en bloc lamination, intermetallic compound (IMC) layer may be formed between the low melting point metal layer 131 and the conductive pattern 120. Moreover, as described above, in the case where the bump 130 includes the low melting point metal layer 131 and the high melting point metal layer 132, the IMC layer may be also formed between the low melting point metal layer 131 and the high melting point metal layer 132.

By using the en bloc lamination, alignment precision may be improved, compared to forming a multilayered substrate by successively laminating unit substrates. This is because providing a high-temperature, high-pressure environment only once during the manufacturing process of a multilayered substrate would help the multilayered substrate to have a relatively smaller warpage and an insulating layer to have a relatively smaller deviation in thickness. Moreover, while it is prone to an alignment error every time a layer is laminated if the multilayered substrate is formed by successively laminating the unit substrates, only a single occurrence of error may be reflected when the unit substrates are laminated en bloc.

Meanwhile, since the multilayered substrate is completed through a single process, it is possible to save costs and a lead time.

Hereinafter, forming the plurality of unit substrates and laminating the unit substrates en bloc will be described in detail.

First Embodiment

Figure 8:
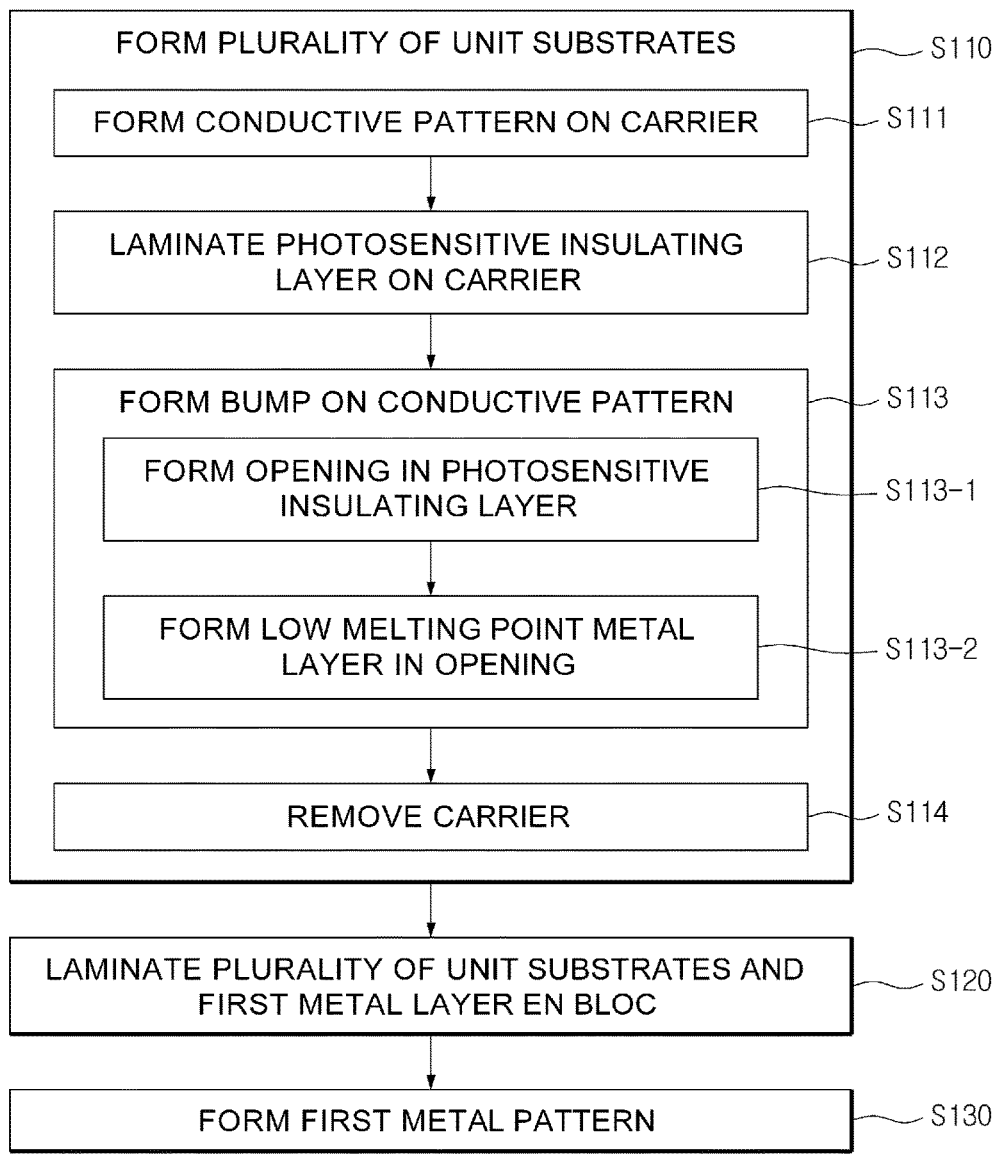
FIG. 8 is a flow diagram illustrating a method of manufacturing a multilayered substrate in accordance with a first embodiment.

FIG. 8 is a flow diagram illustrating a method of manufacturing a multilayered substrate in accordance with a first embodiment.

Referring to FIG. 7, the method of manufacturing a multilayered substrate in accordance with the first embodiment may include forming a plurality of unit substrates (S110) and laminating the plurality of unit substrates en bloc, and the step of laminating the plurality of unit substrates en bloc may include laminating the plurality of unit substrates and first metal layer en bloc (S120). Moreover, the method of manufacturing a multilayered substrate in accordance with the first embodiment may further include forming first metal pattern by patterning the first metal layer (S130).

The step of forming a plurality of unit substrates (S110) may include forming conductive pattern on carrier (S111), laminating photosensitive insulating layer on the carrier (S112), forming bump on the conductive pattern (S113) and removing the carrier (S114).

The step of forming the bump on the conductive pattern (S113) may include forming opening in the photosensitive insulating layer (S113-1) and inserting solder paste into the opening (S113-2).

Hereinafter, the step of forming a plurality of unit substrates (S110) will be described.

Forming a Plurality of Unit Substrates

Figure 10A:
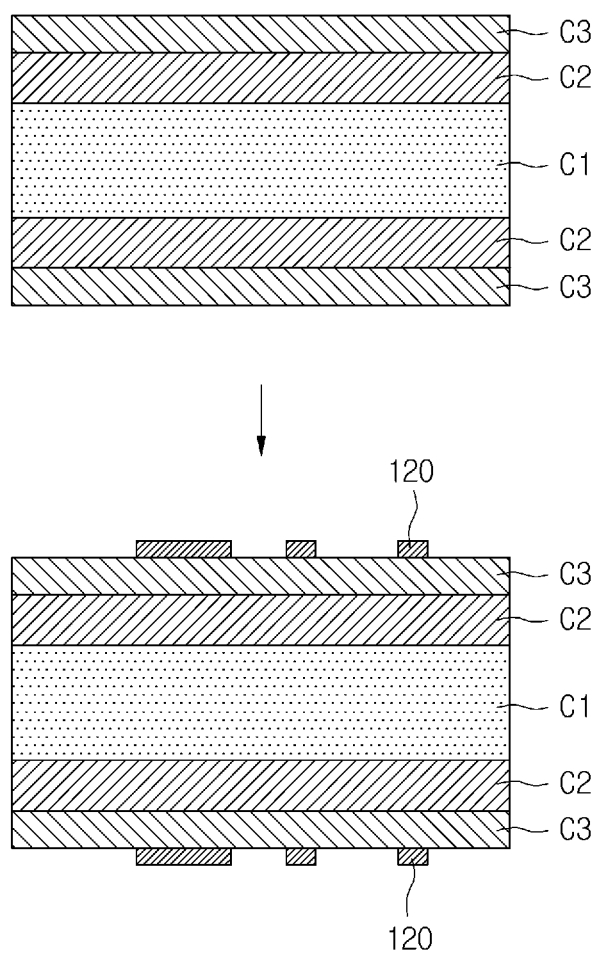
FIG. 10A and FIG. 10B illustrate various carriers that may be used in the processes shown in FIG. 9.
Figure 10B:
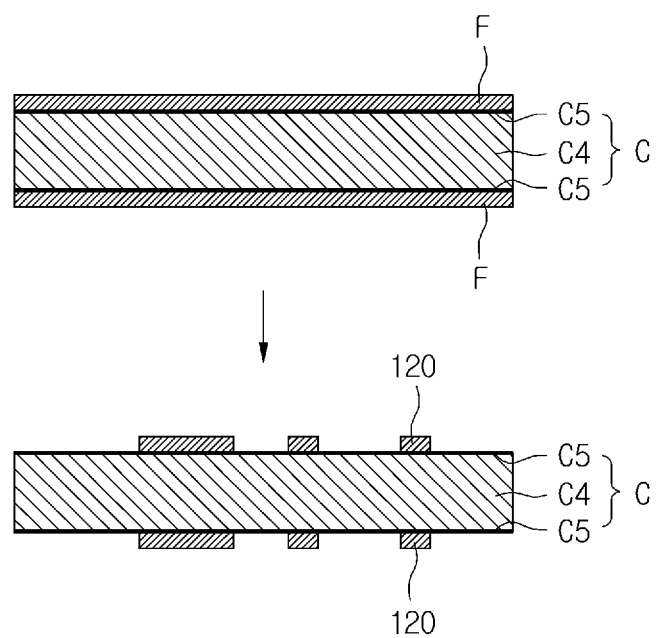

FIG. 9 illustrates processes of forming one of unit substrates, as listed in the flow diagram shown in FIG. 8, by showing a cross-section of the unit substrate, and FIG. 10A and FIG. 10B illustrate various carriers that may be used in the processes shown in FIG. 9.

Referring to (a) of FIG. 9, conductive pattern 120 may be formed on carrier C.

Although it is illustrated in (a) to (e) of FIG. 9 that the forming of the unit substrate is performed on one surface of the carrier C only, this is merely for the purposes of illustration and description. In other words, the illustration of (a) to (e) in FIG. 9 does not exclude the possibility of the forming of the unit substrate being performed on the other surface of the carrier C.

Next, referring to (b) in FIG. 9, photosensitive insulating layer 110 may be formed on the carrier C so as to cover the conductive pattern 120. The photosensitive insulating layer 110 may include photo-curable resin. Moreover, it is possible that inorganic filler is contained in such filler, thereby improving a rigidity of the photosensitive insulating layer 110.

The photosensitive insulating layer 110 may cover the conductive pattern 120 entirely. The photosensitive insulating layer 110 may be laminated on the carrier C by use of a vacuum laminator. However, since the laminated photosensitive insulating layer 110 is not post-cured in the step of forming the unit substrate 10, the photosensitive insulating layer 110 may remain in a semi-hardened state (B-stage).

If the photosensitive insulating layer 110 were fully hardened (C-stage), the photosensitive insulating layer 110 would have no flow or tackiness, making it difficult to laminate the unit substrates 10 en bloc.

By laminating the photosensitive insulating layer 110 en bloc in B-stage, adhesion between the photosensitive insulating layers 110 on different unit substrates 10 may be improved, making it easier to laminate the unit substrates 10 en bloc.

Referring to (c) of FIG. 9, opening O may be formed in the photosensitive insulating layer 110. The opening O may be formed at a portion where the bump 130 is to be formed, by selectively exposing and developing the photosensitive insulating layer 110.

Although the photosensitive insulating layer 110 is given the exposure process, the photosensitive insulating layer 110 may still remain in B-stage with a hardness of, for example, about 10 to 20%, compared to C-stage. Meanwhile, if necessary, the photosensitive insulating layer 110 may be semi-hardened to have the hardness of about 50% through an additional process. The additional semi-hardening process may be carried out using UV rays used for a photolithography process for forming the opening O. Yet, the photosensitive insulating layer 110 may not be fully hardened until the en bloc lamination is made. In other words, the photosensitive insulating layer 110 may stay in B-stage until the plurality of unit substrates are laminated en bloc.

Referring to (d) of FIG. 9, the bump 130 is formed in the opening O of the photosensitive insulating layer 110. In this example, the bump 130 may be formed in the opening by: i) plating low melting point metal, such as solder, in the opening; or ii) inserting low melting point metal paste P, such as solder paste, into the opening O and then drying the inserted low melting point metal paste P.

The solder or solder paste may be mainly made of tin, silver, copper or an alloy of metals selected from tin, silver and copper. Moreover, in this example, the solder paste may not contain flux.

The solder paste may be a sintering type, which is hardened at a relatively high temperature, for example, 800° C., or a hardening type, which is hardened at a relatively low temperature, for example, 200° C. In this example, the solder paste P may be a hardening type, which is hardened at a relatively low temperature so as to prevent the photosensitive insulating layer 110 from being fully hardened when the solder paste P is hardened.

The low melting point metal paste P may have a relatively high viscosity, and the shape of the low melting point metal paste P may be maintained when the low melting point metal paste P is inserted into the opening O. Moreover, the low melting point metal paste P may have low melting point metal particles therein, and owing to these low melting point metal particles, the surface of the low melting point metal paste P inserted into the opening O may be rough.

Meanwhile, the low melting point metal paste P may be hot-air dried, if necessary, to keep the shape thereof more stably.

The bump 130 formed as described above may be protruded from an upper surface of the photosensitive insulating layer 110, but it is also possible that an upper surface of the bump 130 may be substantially coplanar with the upper surface of the photosensitive insulating layer 110, unlike (d) of FIG. 9.

Moreover, as illustrated in (d) of FIG. 9, the upper surface of the bump 130 may be flat, but the shape of the upper surface of the bump 130 is not restricted what is illustrated herein, and it is also possible that the upper surface of the bump 130 is curved to be bulged out. Alternatively, the upper surface of the bump 130 may be mostly flat but curved at an edge thereof.

Referring to (c) of FIG. 9, the carrier C may be removed. Once the carrier C is removed, unit substrate 10 may be provided. The photosensitive insulating layer 110 of the unit substrate 10 formed as described above is in B-stage, rather than in C-stage, with the hardness of about 10 to 50%.

FIG. 10A and FIG. 10B illustrate examples of two types of carriers C used in FIG. 9. However, it should be noted that the carrier C used in FIG. 9 is not limited to these types.

Depending on what kind of carrier C is used, specific details of the step of forming the conductive pattern 120 and the step of removing the carrier C may be varied.

Firstly, referring to FIG. 10A, the carrier C may have two layers of metal foils C2, C3 formed on both surfaces of resin layer C1. The resin layer C1 may be prepreg (PPG), and the two layers of metal foils C2, C3 may be made of a same metal. For example, the two layers of metal foils C2, C3 may be, respectively, first copper foil and second copper foil. In this example, the first copper foil may be formed on both surfaces of PPG, and the second copper foil may be formed on the first copper foil. Nevertheless, the type of copper foils C2, C3 may not be limited to copper described above.

Hereinafter, the following description will be provided by assuming that the metal foils C2, C3 are copper foils.

The first copper foil C2 and the second copper foil C3 may be joined together by release layer (not shown). The release layer may be, for example, a tape. The first copper foil C2 may be thicker than the second copper foil C3. The first copper foil C2 may have a thickness between about 12 um and 18 um, and the second copper foil C3 may have a thickness between about 2 um and 5 um.

Since the first copper foil C2 and the second copper foil C3 may be separated from each other if liquid is penetrated at an interface thereof, each of the copper foils may be treated with liquid-proofing measure.

The conductive pattern 120 may be formed by modified semi-additive process (MSAP) that uses the second copper foil C3 as seed layer. That is, the conductive pattern 120 may be formed through an electroplating method that uses the second copper foil C3 as the seed layer. Alternatively, the conductive pattern 120 may be formed using an additive process or a semi-additive process.

In the case where the conductive pattern 120 is formed using the additive, semi-additive or modified semi-additive process, the conductive pattern 120 may be formed by laminating dry film on the second copper foil C3, removing a portion of the dry film through selective exposure and development, and plating the portion where the dry film is removed.

When the carrier C is removed, boundary between the first copper foil C2 and the second copper foil C3 may be separated by the release layer. Thereafter, the second copper foil C3 may be individually removed through an etching process.

In other words, in the case where the carrier C is constituted with the resin layer C1, the first metal foil C2 and the second metal foil C2, the resin layer C1 and the first metal foil C2 may be removed first, and then the second metal foil C3 may be removed through an additional process such as etching.

Referring to FIG. 10B, the carrier C may include resin film C4 and adhesive layer C5. For example, the resin film C4 may be PET film.

A raw material used in the process of forming the conductive pattern 120 may have metal foil F coupled to the resin film C4 by the adhesive layer C5, in which case the metal foil F may be copper foil which may have a thickness of about 12 um to 18 um. The metal foil F is formed first on the adhesive layer C5.

The copper foil F may become the conductive pattern 120 by the subtractive or tenting process. In the subtractive or tenting process, the copper foil may be patterned by etching. By forming the conductive pattern 120 through the subtractive or tenting process, deviation in thickness of the conductive pattern 120 may be reduced. Particularly, by forming the conductive pattern 120 by the tenting process, costs may be saved.

Meanwhile, in the case where the carrier C includes the resin film C4 and the adhesive layer C5, once the photosensitive insulating layer 110 is separated from the adhesive layer C5, the unit substrate 10 is provides, as shown in (e) of FIG. 9.

Hereinafter, steps for laminating the plurality of unit substrates en bloc will be described.

Laminating Unit Substrates En Bloc

FIG. 11 illustrates processes of laminating unit substrates en bloc, as listed in the flow diagram shown in FIG. 8, by showing cross-sections of the unit substrates.

Referring to FIG. 11, the process of laminating the unit substrates en bloc may include arranging the plurality of unit substrates 10 above and below one another, disposing first metal layer 140 on an uppermost layer, and laminating the plurality of unit substrates 10 and the first metal layer 140 en bloc.

When laminating the plurality of unit substrates 10 en bloc, an alignment mark may be used to align each of the unit substrates 10, and the V-Press laminator may be used to hot press and bond every layer en bloc.

During the en bloc lamination, the temperature may be set to, but not limited to, about 180 to 200° C., and the pressure may be set to, but not limited to, about 30 to 50 kg/cm². The temperature and pressure for lamination may be differently configured depending on a composition of the photosensitive insulating layer 110 and a composition of the low melting point metal layer 131. Particularly, the temperature for en bloc lamination may be higher than a melting point of the low melting point metal layer 131 of the bump 130.

During the en bloc lamination, upper portion of the low melting point metal layer 131 may be melted and spread radially by a predetermined distance by a pressure applied by a lower surface of a neighboring unit substrate (particularly, the conductive pattern 120), allowing the neighboring unit substrate to be joined. In this example, due to the spreading of the low melting point metal layer 131 of the bump 130 after the en bloc lamination, a cross-sectional area of an upper portion of the bump 130 may be greater than that of a lower portion of the bump 130. That is, owing to the pressure during the en bloc lamination, the upper portion of the bump 130 may be spread to the photosensitive insulating layer 110, which is in B-stage, and the cross-sectional area of the upper portion of the bump 130 may be greater than that of the lower portion thereof.

Moreover, the photosensitive insulating layers 110, which have been in B-stage, may become C-stage after the en bloc lamination. Moreover, the bumps 130 may also become C-stage.

The first metal layer 140 may become a source of first metal pattern 141. Specifically, after the unit substrates 10 and the first metal layer 140 are laminated en bloc, the first metal layer 140 may be patterned to become the first metal pattern 141. In this example, the first metal pattern 141 may be formed on the bump 130 formed on the uppermost layer among the plurality of bumps 130 and may be protruded from the photosensitive insulating layer 110 formed on the uppermost layer among the plurality of photosensitive insulating layers 110.

Second Embodiment

Figure 12:
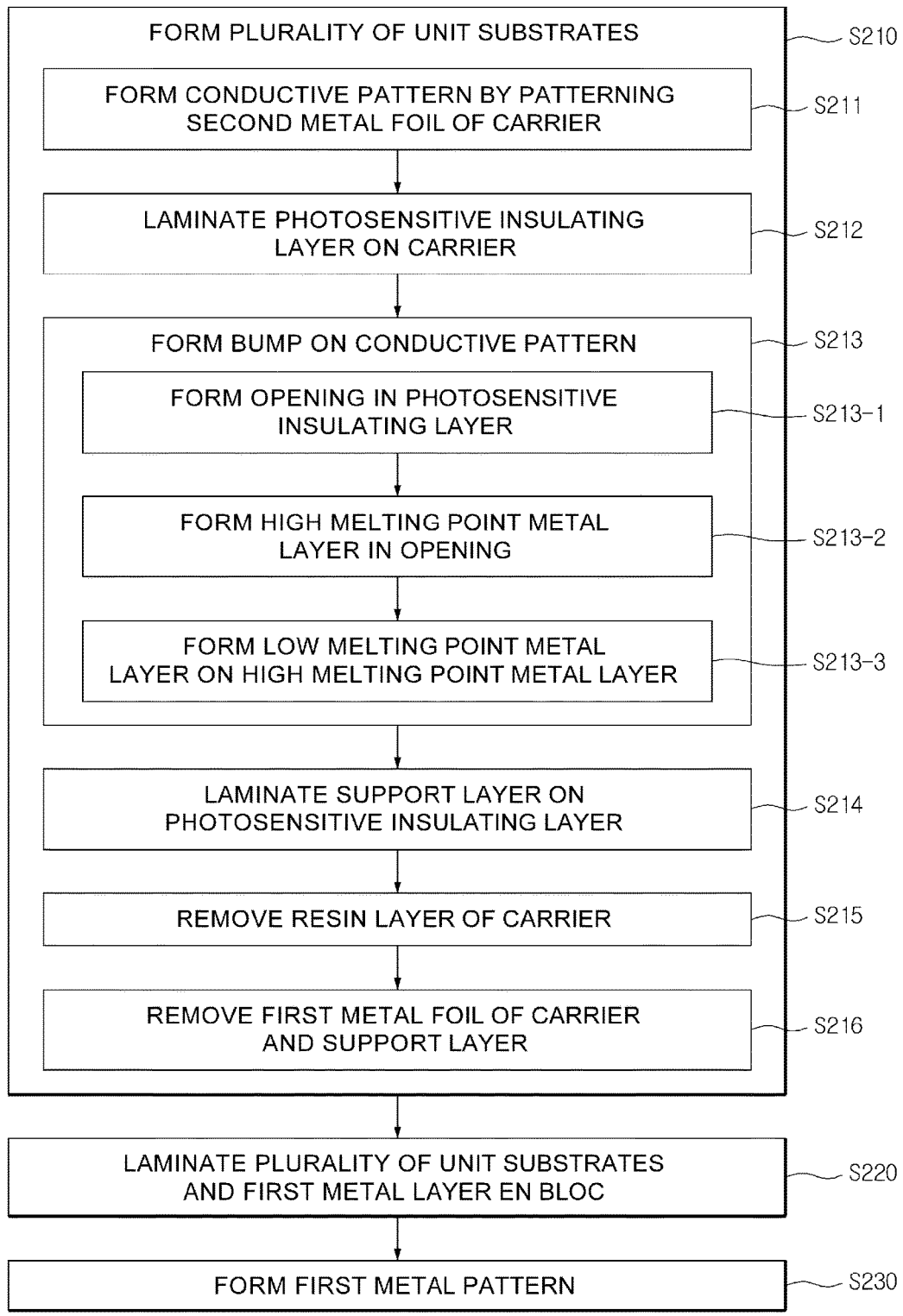
FIG. 12 is a flow diagram illustrating a method of manufacturing a multilayered substrate in accordance with a second embodiment.

FIG. 12 is a flow diagram illustrating a method of manufacturing a multilayered substrate in accordance with a second embodiment, and FIG. 13 illustrates processes of forming one of unit substrates, as listed in the flow diagram shown in FIG. 12, by showing a cross-section of the unit substrate.

Referring to FIG. 12, the method of manufacturing a multilayered substrate in accordance with the second embodiment may include forming a plurality of unit substrates (S210) and laminating the plurality of unit substrates en bloc, and the step of laminating the plurality of unit substrates en bloc may include laminating the plurality of unit substrates and first metal layer en bloc (S220). Moreover, the method of manufacturing a multilayered substrate in accordance with the second embodiment may further include forming first metal pattern by patterning the first metal layer (S230).

The step of forming a plurality of unit substrates (S210) may include forming conductive pattern by patterning second metal foil of carrier (S211), laminating photosensitive insulating layer on the carrier (S212), forming bump on the conductive pattern (S213), laminating support layer on the photosensitive insulating layer (S214), removing resin layer of the carrier (S215) and removing first metal foil of the carrier and the support layer (S216).

In this example, the step of forming the bump on the conductive pattern (S213) may include forming opening in the photosensitive insulating layer (S21301), forming high melting point metal layer in the opening (S213-2) and forming low melting point metal layer on the high melting point metal layer (S213-3).

Compared to the first embodiment described earlier, the method of manufacturing a multilayered substrate in accordance with the present embodiment is different in the step of forming the plurality of unit substrates, and thus the following description will focus on S210, and S220 and S230 will not be redundantly described herein.

Forming a Plurality of Unit Substrates

Referring to (a) in FIG. 13, carrier C may be prepared. In the example, the carrier C may include resin layer C6, first metal foil C7 and second metal foil C8. The first metal foil C7 and the second metal foil C8 may be, respectively, made of materials different from each other. For example, the first metal foil C7 may be nickel (Ni) foil, and the second metal foil C7 may be copper (Cu) foil.

The second metal foil C8 may become a source of conductive pattern 120 and may have a thickness of about 12 um. The first metal foil C7 may be thinner than the second metal foil C8.

The first metal foil C7 and the second metal foil C8 of the carrier C may be formed on both surface of the resin layer C6.

Next, referring to (b) of FIG. 13, the conductive pattern 10 may be formed from the second metal foil C8. That is, the conductive pattern 120 may be formed by patterning the second metal foil C8, whereas the patterning may be an etching process such as half etching. In this example, the conductive pattern 120 may be formed by, but not limited to, the subtractive process, for the purpose of saving manufacturing costs.

In the case where the conductive pattern 120 is formed by the subtractive process, the second metal foil C8 may be formed on an entire surface of the first metal foil C7, and the second metal foil C8 may be etched excluding portions thereof that are to be the conductive pattern 120.

In this example, before the etching is performed, patterned etching resist may be formed on the second metal foil C8. The patterned etching resist may be formed by forming etching resist, which is photosensitive, throughout an entire surface of the second metal foil C8 and then selectively exposing and developing the etching resist. The patterned etching resist may expose the second metal foil C8 excluding portions thereof that are to become the conductive pattern 120. The second metal foil C8 may make contact with etchant whilst the patterned etching resist is formed on the second metal foil C8, whereas the etchant may be a material that reacts selectively to the second metal foil C8. After the conductive pattern 120 is formed, the patterned etching resist may be removed.

The second metal foil C8 may have a thickness of about 12 to 18 um, before becoming the conductive pattern 120. For example, the conductive pattern 120 formed by pattering the second metal foil C8 having the thickness of about 12 um may have a width of about 20 um and an inter-pattern space of about 20 um.

Since the first metal foil C7 and the second metal foil C8 may be formed on both surfaces of the resin layer C6, the conductive pattern 120 may be formed on both upper portion and lower portion of the resin layer C6. In other words, while only the upper portion of the resin layer C6 is illustrated in (b) of FIG. 13, this illustration shall not exclude the possibility of the conductive pattern 120 formed on both surfaces.

Referring to (c) in FIG. 13, after the conductive pattern 120 is formed from the second metal foil C8 of the carrier C, photosensitive insulating layer 110 may be formed on the carrier C. The photosensitive insulating layer 110 may include photo-curable resin, which may have inorganic filler contained therein and thus may control a rigidity of the photosensitive insulating layer 110.

Referring to (d) in FIG. 13, opening O is formed in the photosensitive insulating layer 110. As the photosensitive insulating layer 110 is selectively exposed and developed, the opening O may be formed at a portion of the photosensitive insulating layer 110 where bump 130 is to be formed.

Referring to (e) and (f) in FIG. 13, bump 130 is formed in the opening O of the photosensitive insulating layer 110. Unlike the bump 130 (in FIG. 9) formed by the method of manufacturing a multilayered substrate in accordance with the first embodiment, the bump 130 formed by the method of manufacturing a multilayered substrate in accordance with the present embodiment may include high melting point metal layer 132 formed on the conductive pattern 120 and low melting point metal layer 131 formed on the high melting point metal layer 131.

Referring to (e) in FIG. 13, the high melting point metal layer 132 may be formed in the opening O. The high melting point metal layer 132 may be made of copper. The high melting point metal layer 132 may be formed by electroplating. In forming the high melting point metal layer 132 by electroplating, the conductive pattern 120 may be used as seed layer.

Although it is illustrated in (e) of FIG. 13 that upper surface of the high melting point metal layer 132 is lower than upper surface of the photosensitive insulating layer 110, a height of the upper surface of the high melting point metal layer 132 may not be restricted to what is illustrated herein.

Referring to (f) in FIG. 13, the low melting point metal layer 131 may be formed on the high melting point metal layer 132.

The low melting point metal layer 131 may be formed by plating a low melting point metal, such as solder, in the opening O or by coating and drying a low melting point metal past P, such as solder paste. The low melting point metal layer 131 may be thinner than the high melting point metal layer 132. A surface of the high melting point metal layer 132 may be relatively smooth, and a surface of the low melting point metal layer 131 formed by coating the low melting point metal paste P may be relatively rough.

The solder or solder paste may be mainly made of tin, silver, copper or an alloy of metals selected from tin, silver and copper. Moreover, in this example, the solder paste may not contain flux.

The low melting point metal layer 131 may be protruded from the photosensitive insulating layer 110. A height of protrusion of the low melting point metal layer 131 from the photosensitive insulating layer 110 may be 3 um or less.

Meanwhile, upper surface of the low melting point metal layer 131 may be coplanar with the upper surface of the photosensitive insulating layer 110. That is, the high melting point metal layer 132 may be formed to be lower than the height of the opening O, and the remaining portion of the opening O may be filled by the low melting point metal layer 131.

The low melting point metal paste P may be hot-air dried, if necessary, and the dried low melting point metal paste P may become the low melting point metal layer 131. If drying is not required, the low melting point metal paste P may directly become the ow melting point metal layer 131.

Referring to (g) in FIG. 13, support layer B is formed on the photosensitive insulating layer 110. The support layer B may function to support the photosensitive insulating layer 110 and may function to protect the bump 130. The support layer B may have a height sufficient to cover an upper surface of the bump 130. Based on requirements by a person in the art, however, the support layer B may only cover lateral surface of the bump 130 and may not cover the upper surface of the bump 130. This kind of support layer B may be a resin on a film.

Referring to (h) in FIG. 13, a portion of the carrier C, specifically, the resin layer C6, may be removed. A release layer may be interposed between the first metal foil C7 and the resin layer C6 so that the first metal foil C7 and the resin layer C6 may be readily separated. A result of the step illustrated in (h) of FIG. 13 may be a substrate with the support layer B and the first metal foil C7 laminated on either surface of the photosensitive insulating layer 110.

Without the support layer B, the insulating layer 110 may be excessively warped when the resin layer C6 is separated from the first metal foil C7.

Referring to (i) in FIG. 13, the support layer B and the first metal foil C7 may be removed. Although it is possible that the first metal foil C7 is removed first before removing the support layer B, the order of removing is not limited to this and may be reversed.

The support layer B may be chemically removed using stripper, or may be physically removed. Moreover, the first metal foil C7 may be etched off. A result of the step illustrated in (i) of FIG. 13 is the unit substrate 10.

In this example, etchant for etching the second metal foil C8 may be different from etchant for etching the first metal foil C7. Moreover, since the first metal foil C7 and the second metal foil C8 are different metals from each other that react to different etchants, the first metal foil C7 may not be damaged when the second metal foil C8 is etched, and the conductive pattern 120 may not be damaged when the first metal foil C7 is etched.

Third Embodiment

Figure 14:
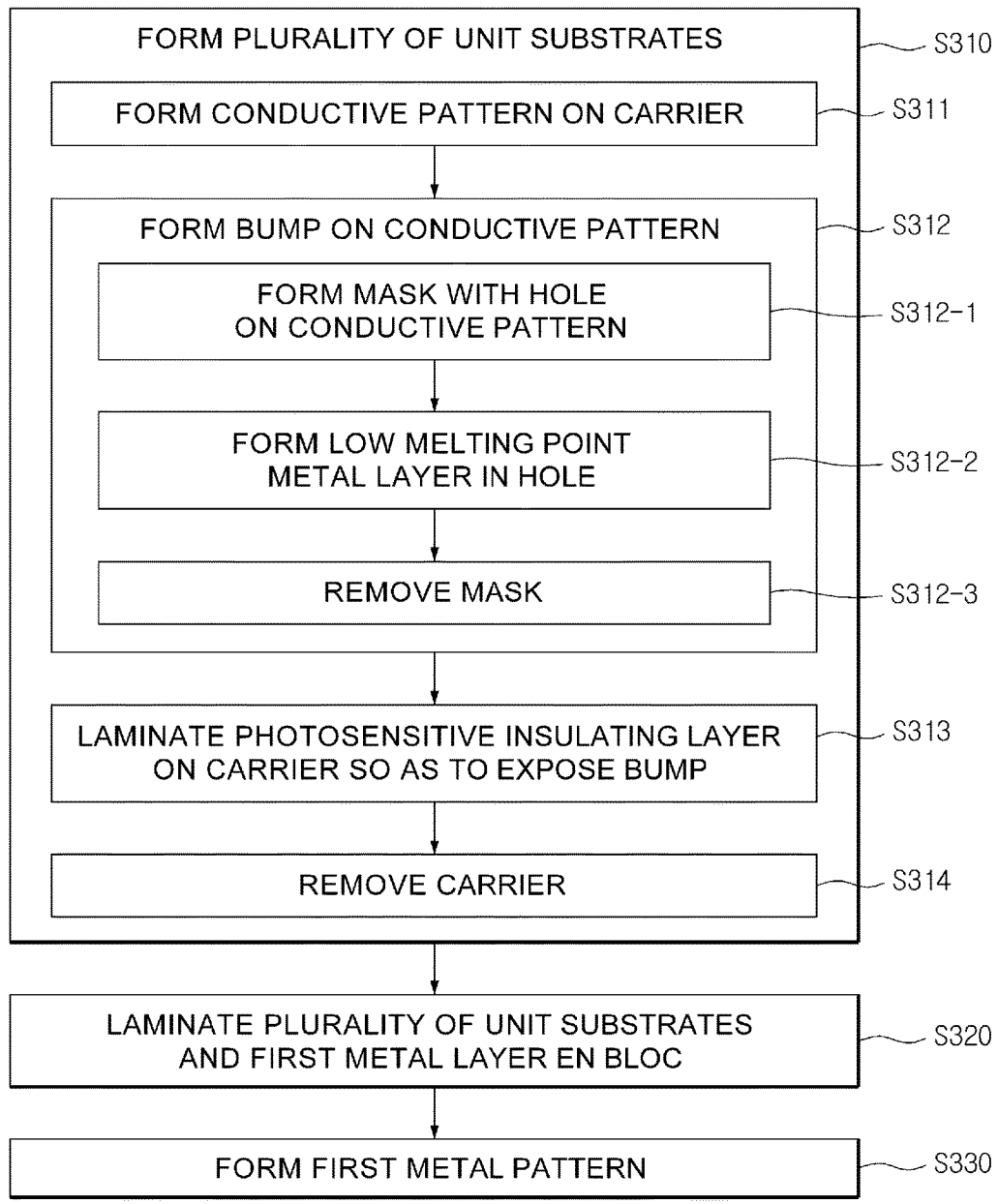
FIG. 14 is a flow diagram illustrating a method of manufacturing a multilayered substrate in accordance with a third embodiment.

FIG. 14 is a flow diagram illustrating a method of manufacturing a multilayered substrate in accordance with a third embodiment.

Referring to FIG. 14, the method of manufacturing a multilayered substrate in accordance with the third embodiment may include forming a plurality of unit substrates (S310) and laminating the plurality of unit substrates en bloc, and the step of laminating the plurality of unit substrates en bloc may include laminating the plurality of unit substrates and first metal layer en bloc (S320). Moreover, the method of manufacturing a multilayered substrate in accordance with the third embodiment may further include forming first metal pattern by patterning the first metal layer (S330).

The step of forming a plurality of unit substrates (S310) may include forming conductive pattern on carrier (S311), forming bump on the conductive pattern (S312), laminating photosensitive insulating layer on the carrier so as to allow the bump to be exposed (S313) and removing the carrier (S314).

The step of forming the bump on the conductive pattern (S312) may include forming mask with a hole on the conductive pattern (S312-1), forming low melting point metal layer in the hole (S312-2), and removing the mask (S312-3).

Compared to the first embodiment described earlier, the method of manufacturing a multilayered substrate in accordance with the present embodiment is different in the step of forming the plurality of unit substrates (S310), and thus the following description will focus on S310, and S320 and S330 will not be redundantly described herein.

Figure 15:
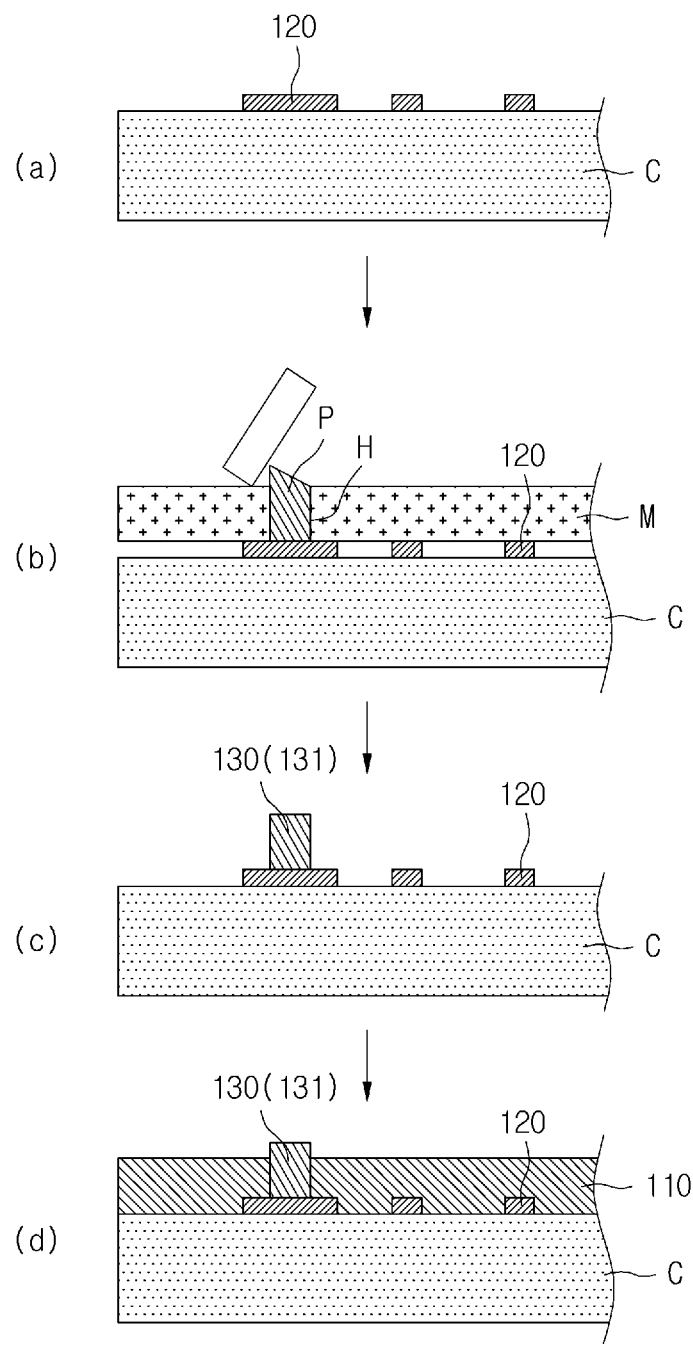
FIG. 15 illustrates processes of forming one of unit substrates, as listed in the flow diagram shown in FIG. 14, by showing a cross-section of the unit substrate.

FIG. 15 illustrates processes of forming one of the plurality of unit substrates by showing a cross-section of the unit substrate.

Unlike the methods of manufacturing a multilayered substrate in accordance with the first and second embodiments, bump 130 is formed before photosensitive insulating layer 110 in the method of manufacturing a multilayered substrate in accordance with the present embodiment.

Referring to (a) in FIG. 15, conductive pattern 120 is formed on carrier C. Although the carrier described with reference to FIG. 10A and FIG. 10B is illustrated in (a) of FIG. 15, the carrier described with reference to FIG. 11 and FIG. 12 may be also used.

The conductive pattern 120 may be formed by, but not limited to, the additive process, the subtractive process, the semi additive process, the tenting process, or the modified semi-additive process. Referring to (b) in FIG. 15, mask M with hole H may be disposed on the conductive pattern 120, and low melting point metal paste P, such as solder paste, may be inserted into the hole H.

The hole H of the mask M may be pre-formed at a position corresponding to where the bump 130 is to be formed. The mask M may be made of a metallic material.

After disposing the mask M on the conductive pattern 120, the low melting point metal paste P may be squeezed into the hole H.

Referring to (c) in FIG. 15, the mask M may be removed. The low melting point metal paste P may have a relatively high viscosity, and the bump 130 may maintain its shape on the conductive pattern 120 even after the mask M is removed. Moreover, the low melting point metal paste may further maintain its shape by being hardened through a drying step.

Meanwhile, the solder paste used for the low melting point metal paste P may be made of tin, silver, copper or an alloy of metals selected from tin, silver and copper, and a surface of the bump 130 formed with the solder paste may be rough.

Referring to (d) in FIG. 15, the photosensitive insulating layer 110 may be laminated on the carrier C, and the bump 130 may be exposed from the photosensitive insulating layer 110, and upper surface of the bump 130 may be protruded above upper surface of the photosensitive insulating layer 110.

In this example, although the photosensitive insulating layer 110 laminated on the carrier C may have opening pre-formed at a region thereof corresponding to the position of the bump 130, the upper surface of the bump 130 may be protruded above the upper surface of the photosensitive insulating layer 110 even if the opening is not formed if the bump 130 has a sufficient rigidity.

By removing the carrier C after the steps of (a) to (d) illustrated in FIG. 15, a unit substrate is prepared. Meanwhile, as described earlier, support layer may be formed on the photosensitive insulating layer 110 before removing the carrier C. The support layer may be removed from the unit substrate after the carrier C is removed.

The unit substrate may be prepared in plurality, and the plurality of unit substrates and first metal layer 140 may be laminated en bloc, and then first metal pattern 141 may be formed by patterning the first metal layer 140.

Fourth Embodiment

Figure 16:
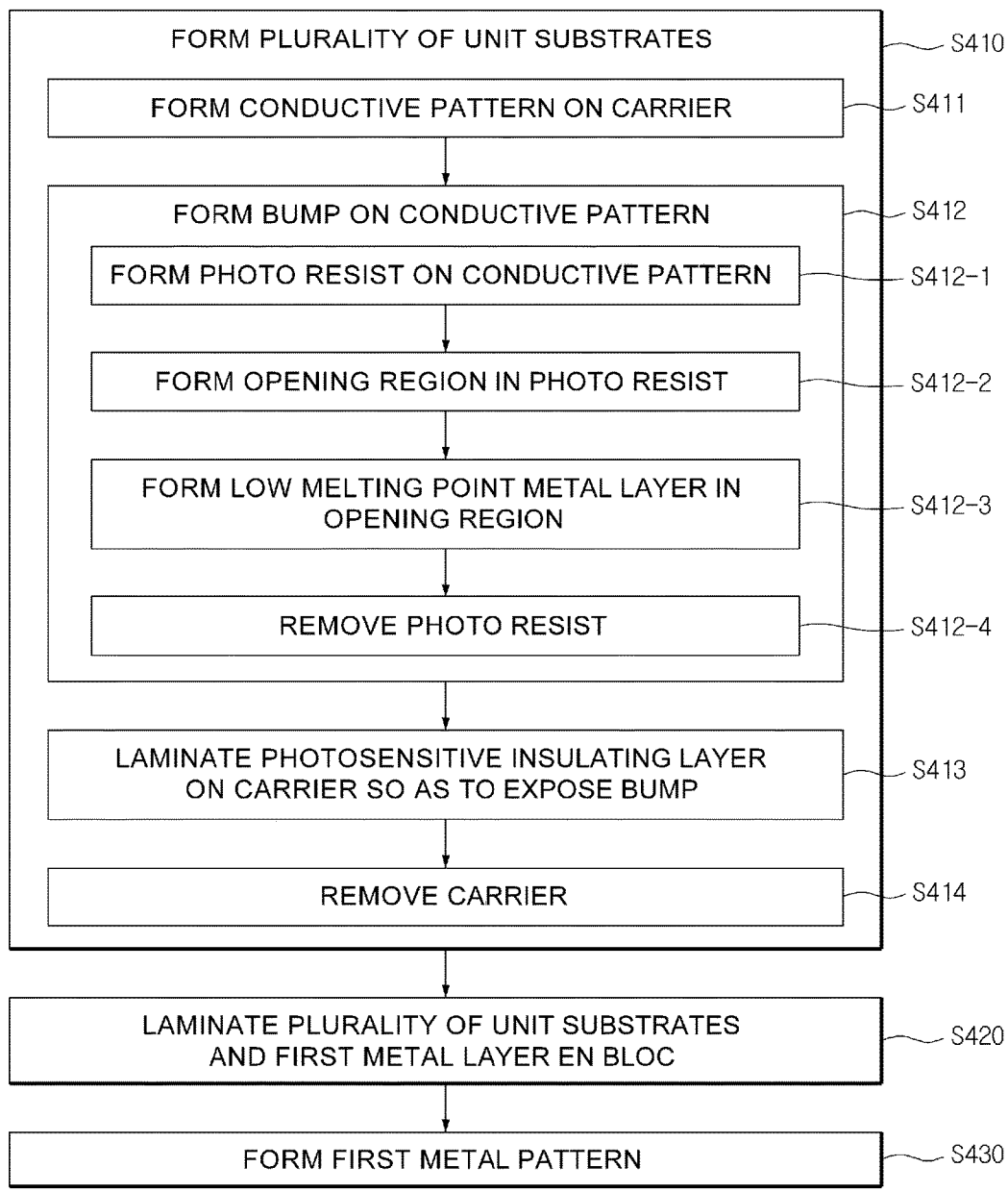
FIG. 16 is a flow diagram illustrating a method of manufacturing a multilayered substrate in accordance with a fourth embodiment.

FIG. 16 is a flow diagram illustrating a method of manufacturing a multilayered substrate in accordance with a fourth embodiment.

Referring to FIG. 16, the method of manufacturing a multilayered substrate in accordance with the fourth embodiment may include forming a plurality of unit substrates (S410) and laminating the plurality of unit substrates en bloc, and the step of laminating the plurality of unit substrates en bloc may include laminating the plurality of unit substrates and first metal layer en bloc (S420). Moreover, the method of manufacturing a multilayered substrate in accordance with the fourth embodiment may further include forming first metal pattern by patterning the first metal layer (S430).

The step of forming a plurality of unit substrates (S410) may include forming conductive pattern on carrier (S411), forming bump on the conductive pattern (S412), laminating photosensitive insulating layer on the carrier so as to expose the bump (S413) and removing the carrier (S414).

In this example, the step of forming the bump on the conductive pattern (S412) may include forming photo resist on the conductive pattern (S412-1), forming opening region in the photo resist (S412-2) forming low melting point metal layer in the opening region (412-3) and removing the photo resist (413-4).

Hereinafter, the step of forming a plurality of unit substrates (S410) will be described.

Figure 17:
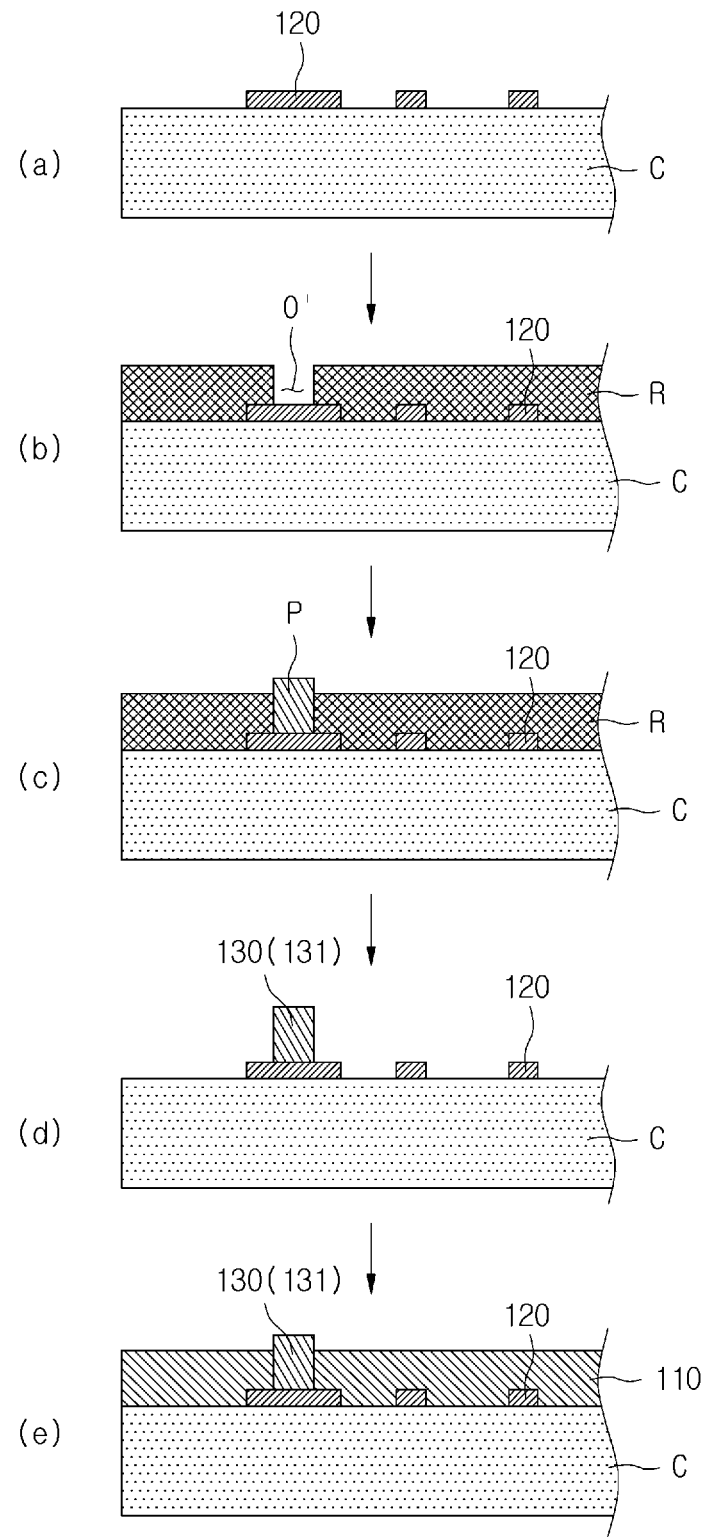
FIG. 17 illustrates processes of forming one of unit substrates, as listed in the flow diagram shown in FIG. 16, by showing a cross-section of the unit substrate.

FIG. 17 illustrates processes of forming one of unit substrates, as listed in the flow diagram shown in FIG. 16, by showing a cross-section of the unit substrate.

Referring to (a) in FIG. 17, conductive pattern 120 may be formed on carrier C. Although the carrier described with reference to FIG. 10A and FIG. 10B is illustrated in (a) of FIG. 17, the carrier described with reference to FIG. 11 and FIG. 12 may be also used.

The conductive pattern 120 may be formed by, but not limited to, the additive process, the subtractive process, the semi additive process, the tenting process, or the modified semi-additive process.

While the photosensitive insulating layer 110 is formed before the bump 130 in the first and second embodiments, bump 130 is formed before photosensitive insulating layer 110 in the fourth embodiment as illustrated in (b) and (c) of FIG. 17. Moreover, in the fourth embodiment, a photolithography method is used.

Referring to (b) in FIG. 17, photo resist R may be laminated on the carrier C, and opening region O' may be formed in the photo resist R corresponding to a position of bump 130. The photo resist R may be dry film.

In this example, the photo resist R may be photosensitive, and thus the photo lithography method may be used, and the opening region O' may be selectively removed by exposure and development.

Referring to (c) in FIG. 17, low melting point metal paste P may be inserted into the opening region O', and the low melting point metal paste P may be dried to become low melting point metal layer 131.

Referring to (d) in FIG. 17, the photo resist R may be removed. The photo resist R may be removed using, for example, exfoliation. In such a case, the photo resist R may be removed by stripper, without damaging other portions of the unit substrate.

Even if the photo resist R is removed, the low melting point metal paste P may maintain its shape, owing to its viscosity.

Referring to (e) in FIG. 17, photosensitive insulating layer 110 may be laminated on the carrier C, and bump 130 may be exposed by the photosensitive insulating layer 110, and upper surface of the bump 130 may be protruded above upper surface of the photosensitive insulating layer 110.

Once the carrier C is removed after the steps of (a) to (e) of FIG. 17, unit substrate is prepared. The unit substrate may be prepared in plurality, and the plurality of unit substrates and first metal layer 140 may be laminated en bloc, and then first metal pattern 141 may be formed by patterning the first metal layer 140.

The process of en bloc lamination is identical with the process described above with reference to FIG. 11 and thus will not be described redundantly herein.

Fifth Embodiment

Figure 18:
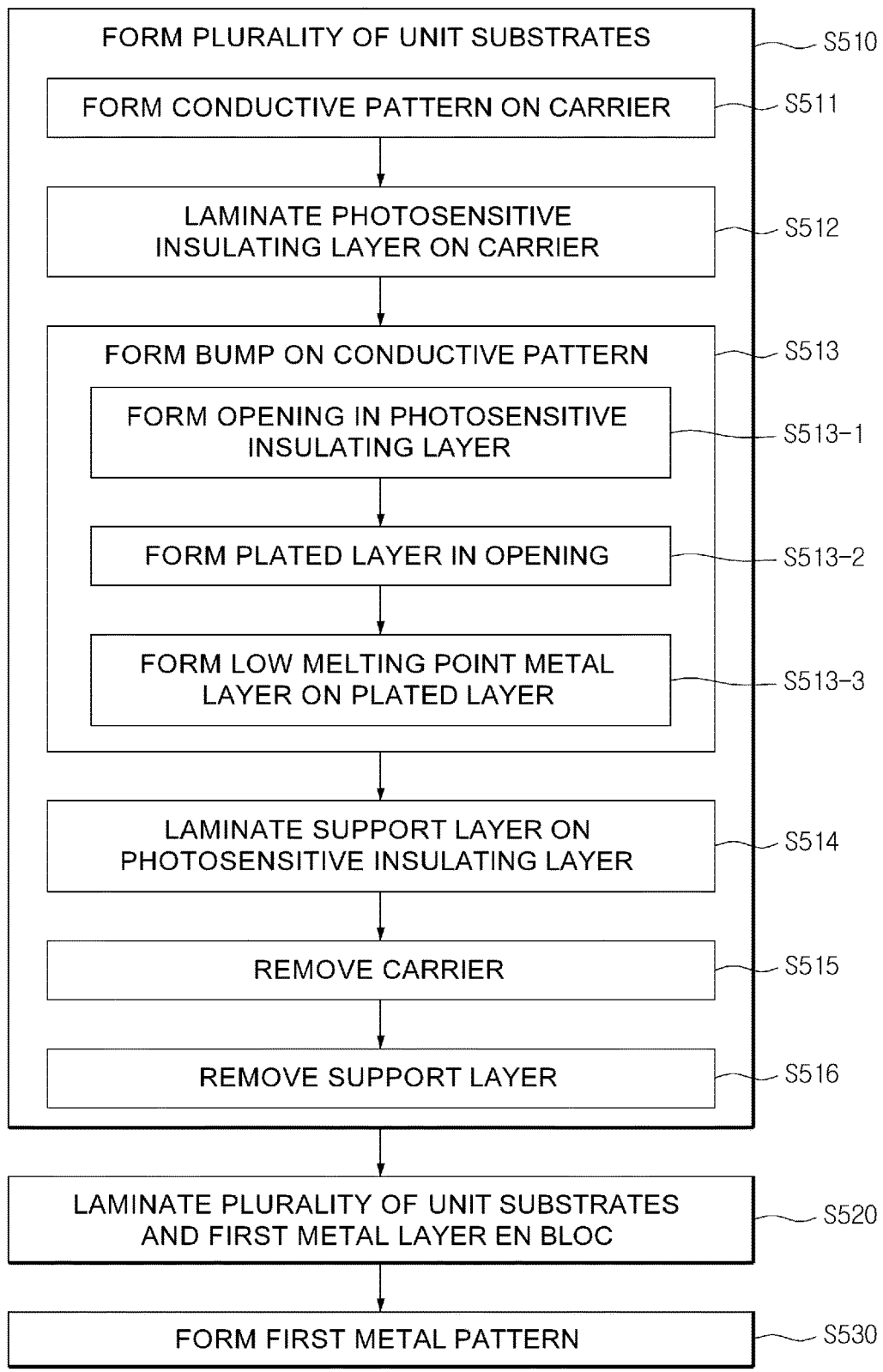
FIG. 18 is a flow diagram illustrating a method of manufacturing a multilayered substrate in accordance with a fifth embodiment.

FIG. 18 is a flow diagram illustrating a method of manufacturing a multilayered substrate in accordance with a fifth embodiment.

Referring to FIG. 18, the method of manufacturing a multilayered substrate in accordance with the fifth embodiment may include forming a plurality of unit substrates (S510) and laminating the plurality of unit substrates en bloc, and the step of laminating the plurality of unit substrates en bloc may include laminating the plurality of unit substrates and first metal layer en bloc (S520). Moreover, the method of manufacturing a multilayered substrate in accordance with the fifth embodiment may further include forming first metal pattern by patterning the first metal layer (S530).

In this example, the step of forming the plurality of unit substrates (S510) may include forming conductive pattern on carrier (S511), laminating photosensitive insulating layer on the carrier (S512), forming bump on the conductive pattern (S513), laminating support layer on the photosensitive insulating layer (S514) and removing the carrier (S515).

The bump 130 may include low melting point metal layer 131 and high melting point metal layer 132 made of metal having a melting point higher than a melting point of the low melting point metal layer 131, and the step of forming the bump on the conductive pattern (S513) may include forming opening in the photosensitive insulating layer (S513-1), forming high melting point metal layer in the opening (S513-2) and forming low melting point metal layer on the high melting point metal layer (S513-3).

In this example, the step of forming the plurality of unit substrates (S510) may further include removing the support layer (S516).

Hereinafter, the step of forming the plurality of unit substrates (S510) will be described.

Figure 19:
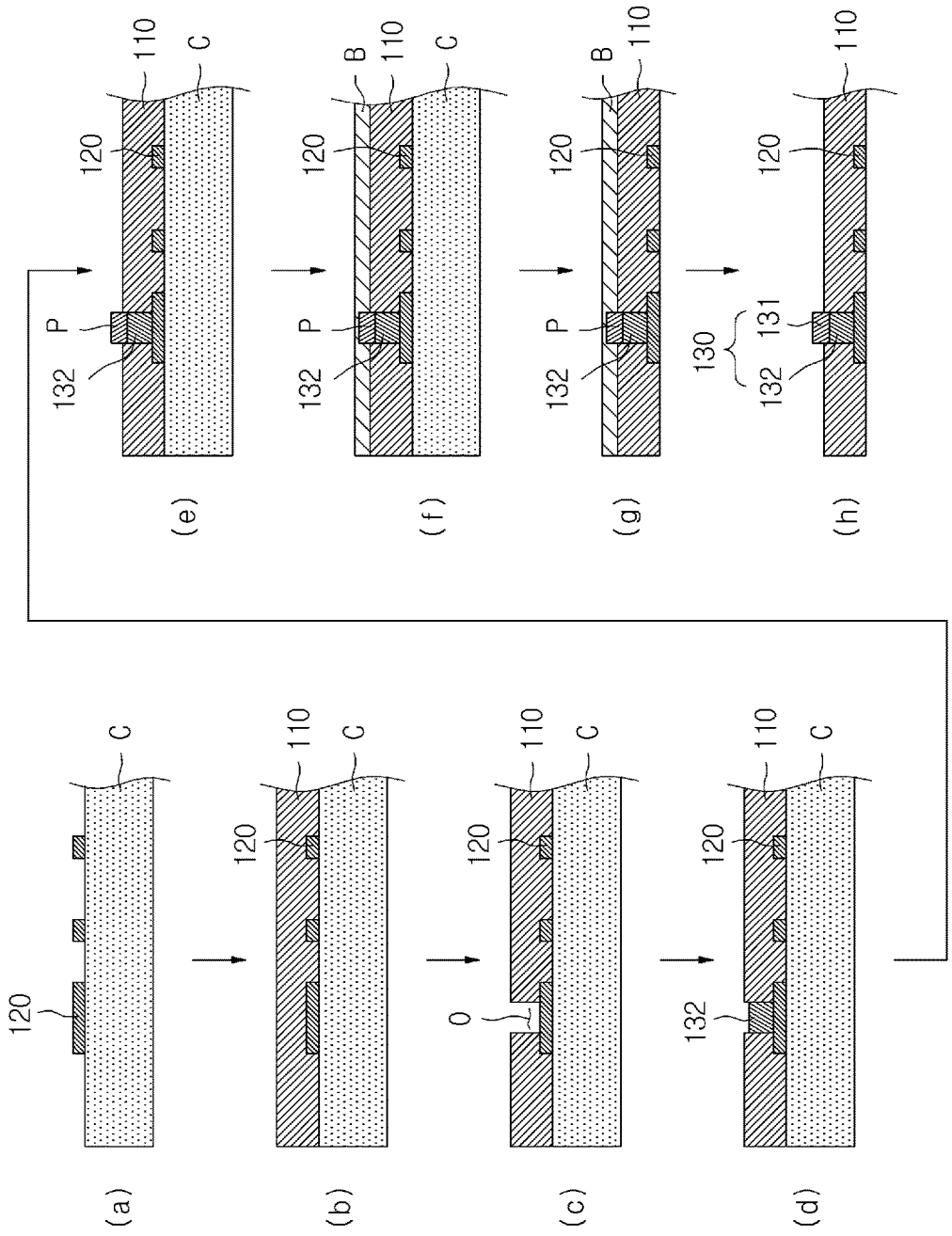
FIG. 19 illustrates processes of forming one of unit substrates, as listed in the flow diagram shown in FIG. 18, by showing a cross-section of the unit substrate.

FIG. 19 illustrates processes of forming one of unit substrates, as listed in the flow diagram shown in FIG. 18, by showing a cross-section of the unit substrate.

Referring to (a) in FIG. 19, conductive pattern 120 may be formed on carrier C. Although the carrier described with reference to FIG. 10A and FIG. 10B is illustrated in (a) of FIG. 19, the carrier described with reference to FIG. 11 and FIG. 12 may be also used.

The conductive pattern 120 may be formed by, but not limited to, the additive process, the subtractive process, the semi additive process, the tenting process, or the modified semi-additive process.

Referring to (b) in FIG. 19, after the conductive pattern 120 is formed on the carrier C, photosensitive insulating layer 110 may be formed. The photosensitive insulating layer 110 may include photo-curable resin, which may have inorganic filler contained therein and thus may control a rigidity of the photosensitive insulating layer 110.

The photosensitive insulating layer 110 may cover the conducive pattern 120 entirely. The photosensitive insulating layer 110 may be laminated on the carrier C using vacuum laminator. However, since the laminated photosensitive insulating layer 110 is not post-cured in the step of forming the unit substrate 10, the photosensitive insulating layer 110 may remain in a semi-hardened state (B-stage).

Referring to (c) of FIG. 19, opening O may be formed in the photosensitive insulating layer 110. Since the photosensitive insulating layer 110 is photosensitive, the opening O may be formed in the photosensitive insulating layer by performing exposure and development without any additional photo resist. The opening O may be formed at a portion where the bump 130 is to be formed, by selectively exposing and developing the photosensitive insulating layer 110.

Referring to (d) in FIG. 19, high melting point metal layer 132, which may be copper layer, may be formed in the opening O. A melting point of the high melting point metal layer 132 may be greater than a melting point of the low high melting point metal layer 131. In other words, the high melting point metal layer 132 may be copper layer, and the low melting point metal layer 131 may be a solder layer that is made of a metal having a lower melting point than copper.

The high melting point metal layer 132 may be formed through electroplating, with the conductive pattern 120 as seed layer, and it may be possible that an individual electroless plating seed layer is formed first and the electroplating layer is formed above the electroless plating seed layer.

Although it is illustrated in (d) of FIG. 19 that upper surface of the high melting point metal layer 132 is lower than upper surface of the photosensitive insulating layer 110, the upper surface of the high melting point metal layer 132 may be substantially coplanar with the upper surface of the photosensitive insulating layer 110. That is, a height of the upper surface of the high melting point metal layer 132 may not be restricted to what is illustrated herein.

Referring to (e) in FIG. 19, the low melting point metal layer 131 may be prepared by plating a low melting point metal, such as solder metal, on the high melting point metal layer 132 or by coating and drying a low melting point metal past P, such as solder paste. The low melting point metal layer 131 may be thinner than the high melting point metal layer 132. A surface of the high melting point metal layer 132 may be relatively smooth, and a surface of the low melting point metal layer 131 formed by coating the low melting point metal paste P may be relatively rough.

The low melting point metal layer 131 may be protruded from the photosensitive insulating layer 110. A height of protrusion of the low melting point metal layer 131 from the photosensitive insulating layer 110 may be 3 um or less.

Meanwhile, upper surface of the low melting point metal layer 131 may be coplanar with the upper surface of the photosensitive insulating layer 110. That is, the high melting point metal layer 132 may be formed to be lower than the height of the opening O, and the remaining portion of the opening O may be filled by the low melting point metal layer 131.

The low melting point metal paste P may be hot-air dried, if necessary, and the dried low melting point metal paste P may become the low melting point metal layer 131. If drying is not required, the low melting point metal paste P may directly become the ow melting point metal layer 131.

The high melting point metal layer 132 and the low melting point metal layer 131 formed as described above may constitute the bump 130.

Referring to (f) in FIG. 19, support layer B may be formed on the photosensitive insulating layer 110. The support layer B may cover the low melting point metal layer 131 completely. The photosensitive insulating layer 110 may have a thickness of about 20 to 60 um, and the support layer B may have a thickness of about 100 um or greater. That is, by being thicker than the photosensitive insulating layer 110, the support layer B may be able to support the photosensitive insulating layer 110. The support layer B may be made of PET material. In the meantime, the support layer B may be referred to as back mask.

The support layer B may be formed in plurality. In this example, the support layer B may be constituted with non-viscous layer and viscous layer. The non-viscous layer may be in direct contact with the low melting point metal layer 131, and the viscous layer may be in contact with the non-viscous layer only and not with the low melting point metal layer 131. Meanwhile, as the viscous layer may cover lateral surfaces of the non-viscous layer, lower surface of the viscous layer may be in contact with the photosensitive insulating layer 110. The viscous layer may be adhered to the photosensitive insulating layer 110 while enveloping the non-viscous layer and the low melting point metal layer 131 therein.

Referring to (g) in FIG. 19, the carrier C may be removed. In this step, in the case where the carrier C is constituted with resin layer C1 and identical first metal foil C2 and second metal foil C2, as illustrated in FIG. 10A, the resin layer C1 and the first metal foil C2 may be removed first, and then the second metal foil C3 may be removed through an additional process such as etching, as described above.

Meanwhile, in the case where the carrier C is constituted with resin layer C4 and adhesive layer C5, as illustrated in FIG. 10B, the resin layer C4 may be removed from the unit substrate by using the adhesive layer C5 as a medium.

In the step (g) of FIG. 19, the support layer B may remain. That is, even though the carrier C is removed, the support layer B may support the photosensitive insulating layer 110, the photosensitive insulating layer 110 may be protected.

Referring to (h) in FIG. 19, the support layer B may be removed. In the case where the support layer B is constituted with two layers of viscous layer and non-viscous layer, by dicing the region where the viscous layer and the photosensitive insulating layer 110 are in contact with each other, the photosensitive insulating layer 110 and the non-viscous layer may be automatically separated.

Through the steps of (a) to (h) of FIG. 19, unit substrate is prepared. The unit substrate may be prepared in plurality, and the plurality of unit substrates and first metal layer 140 may be laminated en bloc, and then first metal pattern 141 may be formed by patterning the first metal layer 140.

The process of en bloc lamination is identical with the process described above with reference to FIG. 11 and thus will not be described redundantly herein.

Sixth Embodiment

Figure 20:
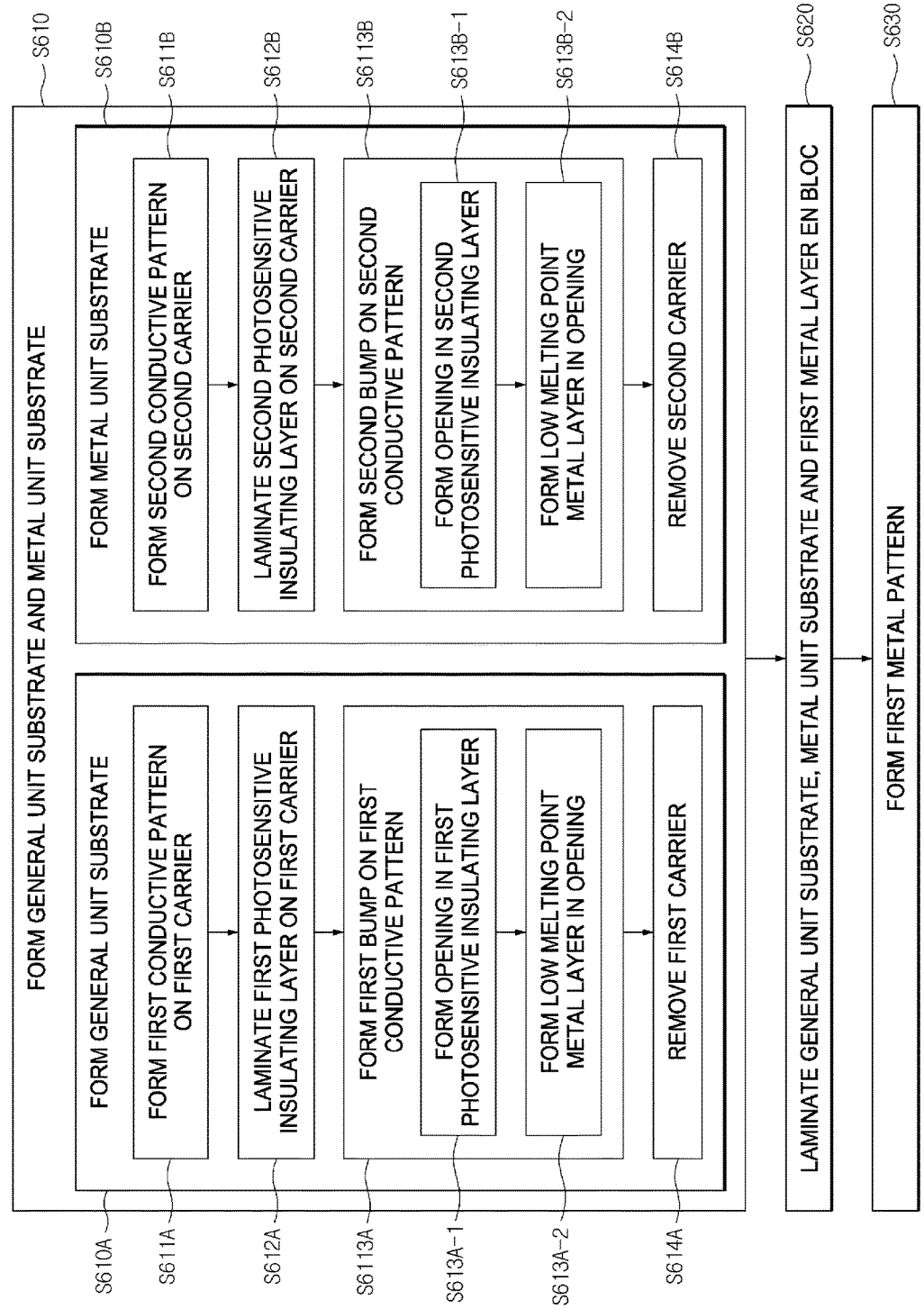
FIG. 20 is a flow diagram illustrating a method of manufacturing a multilayered substrate in accordance with a sixth embodiment.

FIG. 20 is a flow diagram illustrating a method of manufacturing a multilayered substrate in accordance with a sixth embodiment.

Referring to FIG. 20, the method of manufacturing a multilayered substrate in accordance with the sixth embodiment may include forming general unit substrate and metal unit substrate (S610) and laminating a plurality of unit substrates en bloc, and the step of laminating the plurality of unit substrates en bloc may include laminating the general unit substrate, the metal unit substrate and first metal layer en bloc (S620). Moreover, the method of manufacturing a multilayered substrate in accordance with the sixth embodiment may further include forming first metal pattern by patterning the first metal layer (S630).

The step of forming the general unit substrate and the metal unit substrate (S610) may include forming the general unit substrate (S610A) and forming the metal unit substrate (S610B)

In this example, the step of forming the general unit substrate (S610A) may correspond to the step of forming a plurality of unit substrates (S110) described in the method of manufacturing a multilayered substrate in accordance with the first embodiment. Moreover, the general unit substrate manufactured by the step of forming the general unit substrate (S610A) in accordance with the present embodiment may correspond to the unit substrate 10 described in the methods of manufacturing a multilayered substrate in accordance with the second to fifth embodiments, and thus the step of forming the general unit substrate (S610A) in accordance with the present embodiment may be applied with any of the steps of forming a plurality of unit substrates described in the methods of manufacturing a multilayered substrate in accordance with the second to fifth embodiments.

The step of forming first metal pattern (S630) of the present embodiment may correspond to the step of forming first metal described in the methods of manufacturing a multilayered substrate in accordance with the first to fifth embodiments Moreover, the step of laminating the general unit substrate, the metal unit substrate and the first metal layer en bloc (S620) may be substantially identical with the step of laminating the plurality of unit substrates and the first metal layer en bloc (S120, S220, S320, S420, S520) of the methods of manufacturing a multilayered substrate in accordance with the first to fifth embodiments, except that the metal unit substrate 20 is laminated together.

For the above reasons, hereinafter, the description of the method of manufacturing a multilayered substrate in accordance with the present embodiment will be focused on the step of forming the metal unit substrate (S610B).

The step of forming the metal unit substrate (S610B) may include forming second conductive pattern on second carrier (S611B), laminating photosensitive insulating layer on the second carrier (S612B), forming second bump on the second conductive pattern (S613B) and removing the second carrier (S614B).

The step of forming the second bump on the second conductive pattern (S613B) may include forming opening in second photosensitive insulating layer (S613B-1) and forming low melting point metal layer in the opening (S613/b-2).

Figure 21:
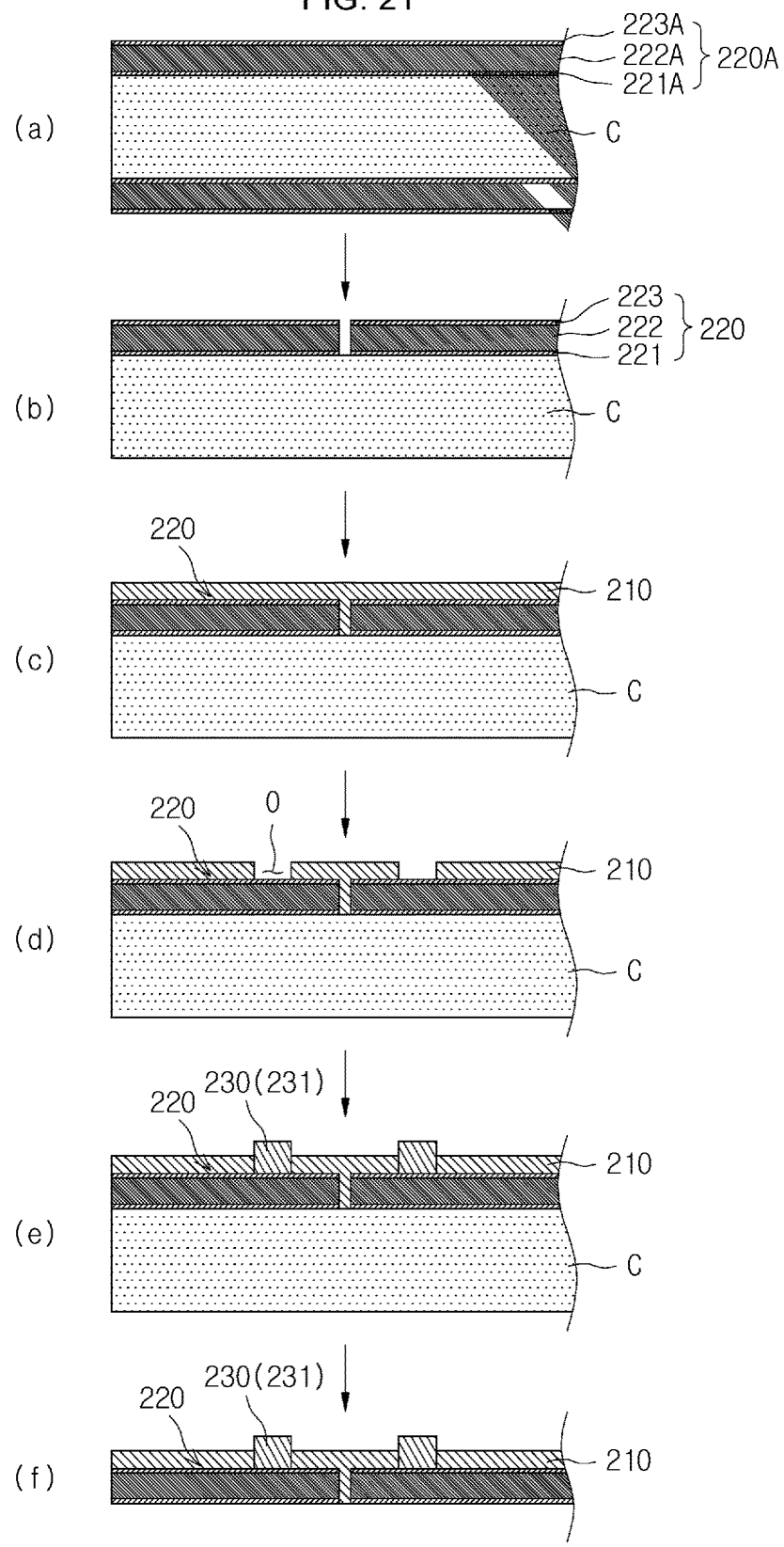
FIG. 21 illustrates processes of forming one of unit substrates, as listed in the flow diagram shown in FIG. 20, by showing a cross-section of the unit substrate.

FIG. 21 illustrates processes of forming the metal unit substrates, as listed in the flow diagram shown in FIG. 20, by showing a cross-section of the unit substrate.

Referring to (a) and (b) in FIG. 21, second conductive pattern 220 may be formed on second carrier C.

As illustrated in (a) of FIG. 21, raw material for manufacturing metal unit substrate 20 may have multi-metal plate 220A laminated on both surfaces of the second carrier C. The multi-metal plate 220A may have first metal foil 221A, second metal foil 222A and third metal foil 223A successively laminated.

The multi-metal plate 220A, the first metal foil 221A, the second metal foil 222A and the third metal foil 223A may each become source of second conductive pattern 220, first conductive layer 221, second conductive layer 222 and third conductive layer 223.

In the present embodiment, the multi-metal plate 220A may use a multi-metal plate in which copper layer is laminated on both surfaces of Invar layer. That is, in the present embodiment, the first metal foil 221A and the third metal foil 223A may be made of copper, and the second metal foil 222A may be made of Invar.

As illustrated in (b) of FIG. 21, the multi-metal plate 220A may be selectively etched to become the second conductive pattern 220. In this example, the selective etching may be performed at an area of the multi-metal plate 220A where electrical opening is required between conductive patterns 220. The conductive pattern 220 is an element for providing rigidity to the multilayered substrate and thus may be formed in most areas of the metal unit substrate 20.

The multi-metal plate 220A may be selectively etched using the conventional subtractive or tenting process. That is, after patterned etching resist is formed on the multi-metal plate 220A, by etching a portion of the multi-metal plate 220A through opening region of the patterned etching resist and removing the patterned etching resist, the unetched area of the multi-metal plate 220A may become the second conductive pattern 220.

In selectively etching the multi-metal plate 220A, the etching process may be performed three times successively or performed only once. In the case of the latter, the multi-metal plate 220A may be selectively etched using an etchant reacting to all of the metals constituting the first to third metal foils 221A, 222A, 223A.

In the case of the former, the etching process may be successively performed with first etching process for etching an area of the third metal foil 223A, second etching process for etching an area of the second metal foil 222A and third etching process for etching an area of the first metal foil 221A. In this example, the etchant for the first etching process may react with copper that constitutes the third metal foil 223A but not with Invar that constitutes the second metal foil 222A. Likewise, the etchant for the second etching process may react with Invar but not with copper that constitutes the first metal foil 221A.

Meanwhile, although it is illustrated in (b) of FIG. 21 that lateral surface of the conductive pattern 220 is perpendicular to upper surface of the carrier C, this is merely for the purpose of illustration. For instance, even if the conductive pattern 220 is formed though anisotropy etching, the lateral surface of the conductive pattern 220 may not be perpendicular to the upper surface of the carrier C due to, for example, process error. Furthermore, even if the conductive pattern j220 is formed through isotropic etching, the lateral surface of the conductive pattern 220 may not be perpendicular to the upper surface of the carrier C.

As illustrated in (c) to (f) of FIG. 21, second photosensitive insulating layer 210 may be laminated on the second carrier C, and opening O may be formed in the second photosensitive insulating layer 210, and second bump 230 may be formed in the opening O. Lastly, by removing the carrier C, the metal unit substrate 20 may be prepared. These steps correspond to S112, S113-1, S113-2 and S114 of the method of manufacturing a multilayered substrate in accordance with the first embodiment and thus will not be redundantly described herein.

Although it is illustrated in (b) to (e) of FIG. 21 that the forming of the metal unit substrate is performed on one surface of the second carrier C only, this is merely for the purposes of illustration and description, and this illustration does not exclude the possibility of the forming of the metal unit substrate being performed on the other surface of the second carrier C.

Moreover, although it is illustrated in (a) of FIG. 21 that the multi-metal plate 220A has a triple layer structure, this is merely an example, and it is possible that the multi-metal plate 220A has a double layer structure or 4 or more layer structure. In the case where the multi-metal plate 220A has a double layer or 4 or more layer structure, the second conductive pattern 220 formed by selectively etching the multi-metal plate 220A may also have a double layer or 4 or more layer structure.

Although it is illustrated in (a) and (b) of FIG. 21 that the second conductive pattern 220 s formed by a subtractive or tenting process, this is merely an example, and the second conductive pattern 220 may be formed using any of the additive process, semi additive process and the modified semi additive process. In the case of the latter, the raw material for forming the metal unit substrate 20 may be the second carrier C itself or the second carrier C laminated with copper foil on both surfaces thereof, unlike (a) in FIG. 21.

Moreover, the step of forming the metal unit substrate is described to be similar to the step of forming a plurality of unit substrates in the method of manufacturing a multilayered substrate in accordance with the first embodiment, the present disclosure shall not be limited to this. That is, the metal unit substrate may be formed using any method similar to the step of forming a plurality of unit substrates (S210, S310, S410, S510) of the method of manufacturing a multilayered substrate in accordance with the second to fifth embodiments.

Seventh Embodiment

Figure 22:
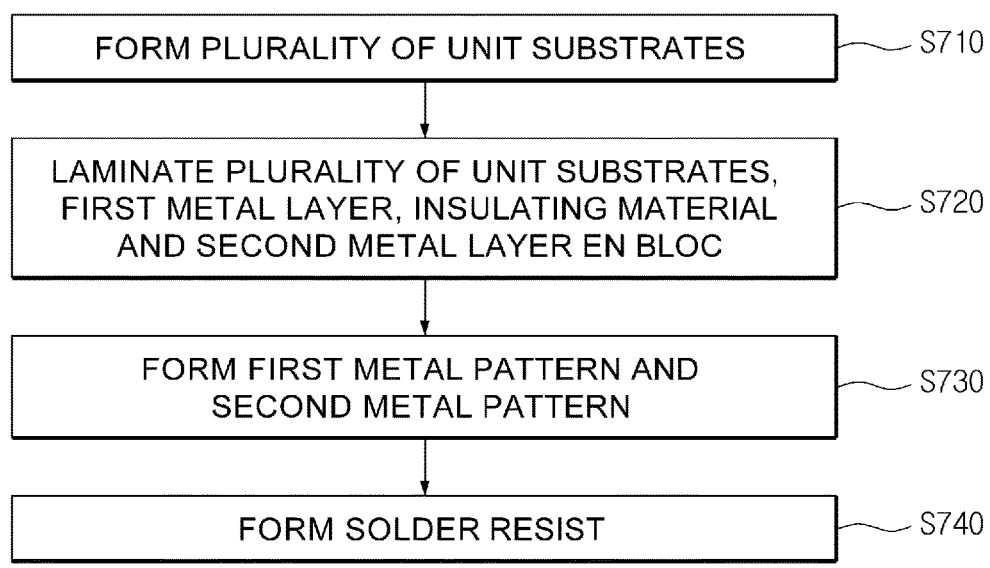
FIG. 22 is a flow diagram illustrating a method of manufacturing a multilayered substrate in accordance with a seventh embodiment.

FIG. 22 is a flow diagram illustrating a method of manufacturing a multilayered substrate in accordance with a seventh embodiment.

The method of manufacturing a multilayered substrate in accordance with the seventh embodiment may include forming a plurality of unit substrates (S710) and laminating the plurality of unit substrates en bloc, and the step of laminating the plurality of unit substrates en bloc may include laminating the plurality of unit substrates, first metal layer, first insulating material and second metal layer en bloc (S720).

The method of manufacturing a multilayered substrate in accordance with the seventh embodiment may further include forming first metal pattern and second metal pattern (S730) and forming solder resist (S740).

In the method of manufacturing a multilayered substrate in accordance with the seventh embodiment the step of forming the plurality of unit substrates (S710) may be applied with any of the steps of forming a plurality of unit substrates described in the methods of manufacturing a multilayered substrate in accordance with the first to sixth embodiments.

Accordingly, the step of forming the plurality of unit substrates (S710) will not be redundantly described herein, and the description will be focused on the step of laminating the plurality of unit substrates en bloc.

Figure 23:
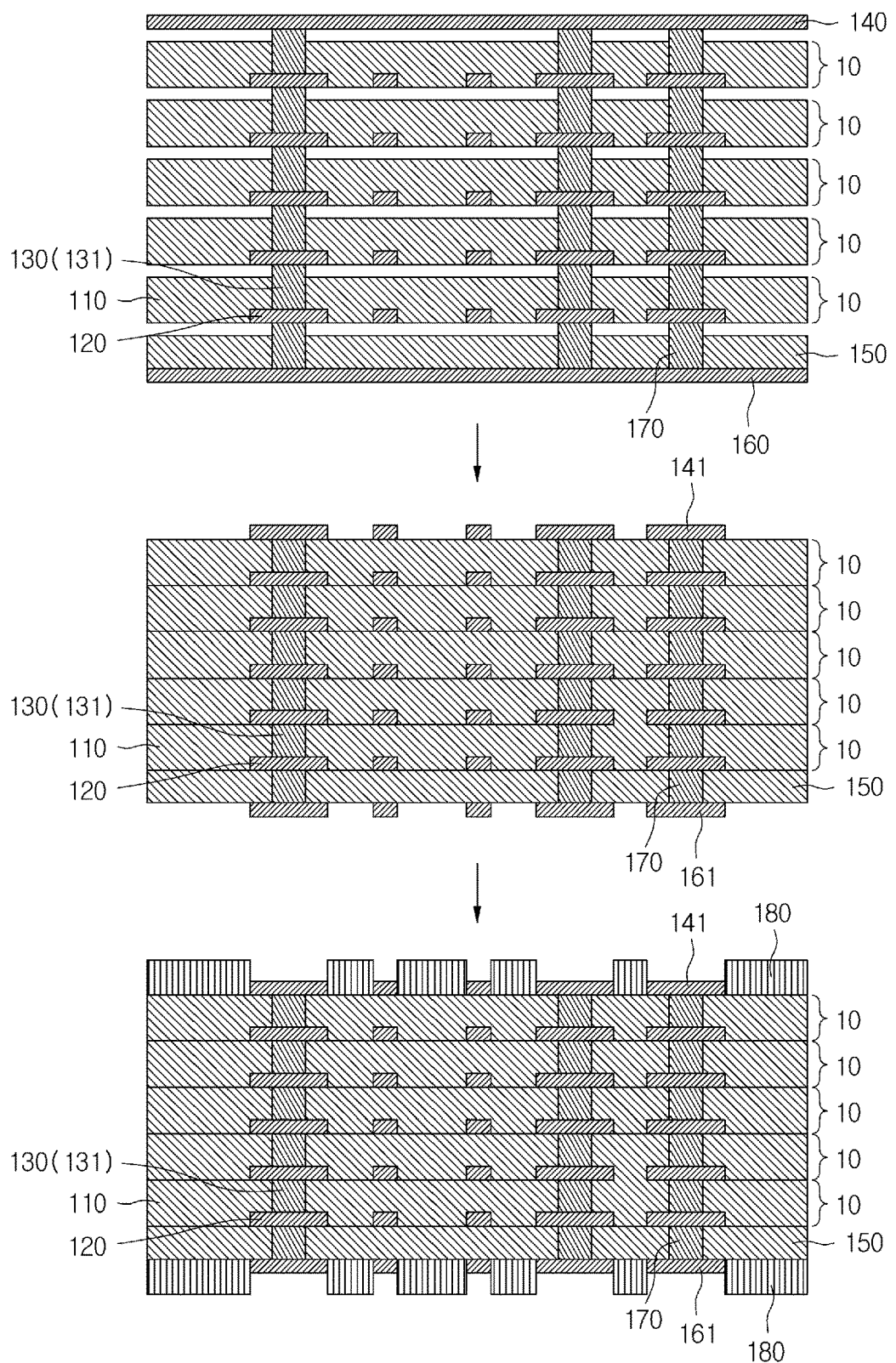
FIG. 23 illustrates processes of laminating unit substrates en bloc, as listed in the flow diagram shown in FIG. 22, by showing a cross-section of the unit substrate.

FIG. 23 illustrates processes of laminating unit substrates, as listed in the flow diagram shown in FIG. 22, by showing a cross-section of the unit substrate.

As described above, in the method of manufacturing a multilayered substrate in accordance with the seventh embodiment, the step of laminating the unit substrates en bloc may include laminating the plurality of unit substrates, first metal layer, insulating material and second metal layer en bloc (S720).

Referring to FIG. 23, a plurality of unit substrates 10 may be arranged above and below one another; first metal layer 140 may be disposed above the plurality of unit substrates 10; insulating material 150 may be disposed below the plurality of unit substrates 10; second metal layer 160 may be disposed below the insulating material 150; and then the plurality of unit substrates 10, the first metal layer 140, the insulating material 150 and the second metal layer 160 may be laminated altogether.

The insulating material 150 may have via 170 formed therein. The via 170 may be made of a same material as that of bump 130. The insulating material 150 and the via 170 may be prepared through the same method as forming the photosensitive insulating layer 110 and the bump 130. However, the insulating material 150 may not have conductive pattern 120 embedded therein, but may have second metal pattern 161 formed on a lower surface thereof through an additional step after the en bloc lamination.

Specifically, after the en bloc lamination, the first metal layer 140 may be patterned to become first metal pattern 141, and the second metal layer 160 may be patterned to become second metal pattern 161.

After the first metal pattern 141 and the second metal pattern 161 are formed, solder resist 180 may be formed thereabove.

Eighth Embodiment

Figure 24:
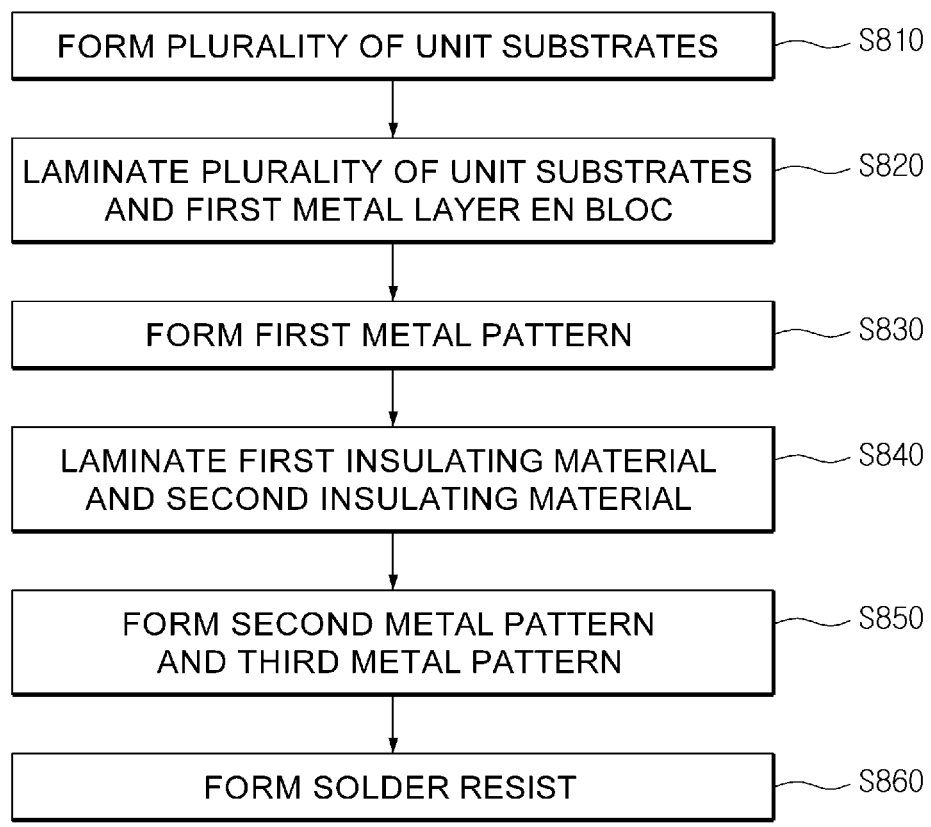
FIG. 24 is a flow diagram illustrating a method of manufacturing a multilayered substrate in accordance with an eighth embodiment.

FIG. 24 is a flow diagram illustrating a method of manufacturing a multilayered substrate in accordance with an eighth embodiment.

The method of manufacturing a multilayered substrate in accordance with the eighth embodiment may include forming a plurality of unit substrates (S810) and laminating the plurality of unit substrates en bloc, and the step of laminating the plurality of unit substrates en bloc may include laminating the plurality of unit substrates and first metal layer en bloc (S820). The method of manufacturing a multilayered substrate in accordance with the eighth embodiment may further include forming first metal pattern (S830), laminating first insulating material and second insulating material (S840), forming second metal pattern and third metal pattern (S850) and forming solder resist (S860).

In the method of manufacturing a multilayered substrate in accordance with the eighth embodiment the step of forming the plurality of unit substrates (S810) may be applied with any of the steps of forming a plurality of unit substrates described in the methods of manufacturing a multilayered substrate in accordance with the first to sixth embodiments.

Accordingly, the step of forming the plurality of unit substrates (S810) will not be redundantly described herein, and the description will be focused on the step of laminating the plurality of unit substrates en bloc.

Figure 25:
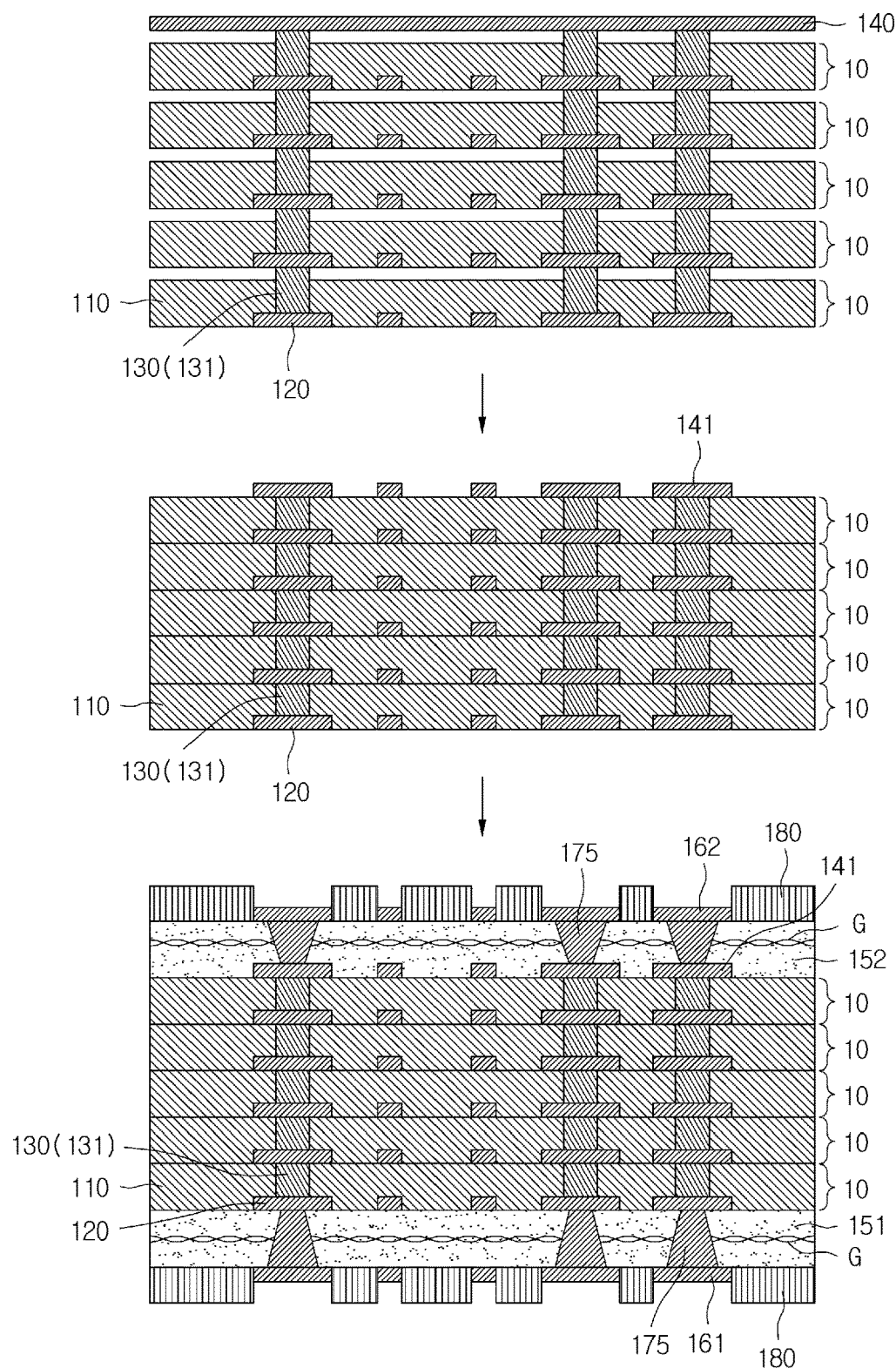
FIG. 25 illustrates processes of laminating unit substrates en bloc, as listed in the flow diagram shown in FIG. 24, by showing a cross-section of the unit substrate.

FIG. 25 illustrates processes of laminating unit substrates en bloc, as listed in the flow diagram shown in FIG. 24, by showing a cross-section of the unit substrate.

In the method of manufacturing a multilayered substrate in accordance with the eighth embodiment, a plurality of unit substrates 10 and first metal layer 140 may be laminated en bloc after disposing the plurality of unit substrates 10 above and below one another and disposing the first metal layer 140 on an uppermost layer.

After the en bloc lamination, the first metal layer 140 may be patterned to form first metal pattern 141.

Then, first insulating material 151 may be laminated at a bottom of the multilayered substrates laminated en bloc, and second insulating material 152 may be laminated at a top of the multilayered substrates laminated en bloc. Then, via hole may be formed in each of the first and second insulating materials 151, 152, and via 175 may be formed by plating the via hole.

Thereafter, second metal pattern 161 may be formed on the first insulating material 151, and third metal pattern 162 may be formed on the second insulating material 152, and solder resist 180 may be formed on the second metal pattern 161 and the third metal pattern 162.

In this example, the first insulating material 151 and the second insulating material 152 may each be made of resin having fiber reinforcement contained therein. For example, the first insulating material 151 and the second insulating material 152 may be prepreg. In this example, the via hole may be formed using laser, such as YAG, $CO_2$, etc., and the via 175 formed by this via hole may have a shape distinguishable from the bump 130.

That is, a cross-sectional area of the via 175 may become smaller toward an inside of the multilayered substrate, while a latitudinal cross-section of the bump 130 may have a consistent shape from top to bottom thereof.

Meanwhile, the fiber reinforcement of the first insulating material 151 and the second insulating material 152 may provide rigidity to the multilayered substrate, and even if the first insulating material 151 and the second insulating material 152 are placed at outermost layers of the multilayered substrate, the multilayered substrate may have a similar rigidity as if reinforcement core is placed in the middle of the multilayered substrate.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A multilayered substrate, comprising:
   an insulating layer;
   a conductive pattern embedded, at least partially, in the insulating layer;
   a metal pattern formed in a protruding manner on the outermost surface of the insulating layer; and
   a bump being electrically connected to the conductive pattern and penetrating the insulating layer,
   wherein the bump comprises:
      a low melting point metal layer having a melting point lower than a melting point of the conductive pattern; and
      a high melting point metal layer having a melting point higher than the melting point of the low melting point metal layer and having a latitudinal cross-sectional area smaller than a latitudinal cross-sectional area of the low melting point metal layer,
      wherein the high melting point metal layer is interposed within the insulating layer between the at least partially embedded conductive pattern and the low melting point metal layer,
      wherein an interface between the high melting point layer and the embedded conductive pattern is formed within the insulating layer, and
      wherein the metal pattern is directly coupled with the low melting point metal layer.

2. The multilayered substrate of claim 1, wherein the insulating layer comprises photo-curable resin.

3. The multilayered substrate of claim 1, wherein the high melting point metal layer is made of copper.

4. The multilayered substrate of claim 1, wherein the insulating layer, the conductive pattern and the bump are each formed in plurality, and wherein the plurality of bumps penetrate the plurality of insulating layers, respectively, to provide interlayer connection between the plurality of conductive patterns.

5. The multilayered substrate of claim 4, wherein at least one of the plurality of conductive patterns is constituted with a plurality of conductive layers, each of which is made of a conductive material different from each other.

6. The multilayered substrate of claim 4, further comprising:

a first metal pattern formed above an uppermost insulating layer of the plurality of insulating layers;

a first insulating material laminated below a lowermost insulating layer of the plurality of insulating layers;

a second metal pattern formed on a lower surface of the first insulating material; and a via penetrating the first insulating material so as to connect the second metal pattern with the conductive pattern embedded in one surface of the lowermost insulating layer.

7. The multilayered substrate of claim 6, wherein the first insulating material comprises photo-curable resin, and wherein the via is made of a material identical with a material of the bump.

8. The multilayered substrate of claim 6, further comprising:

a second insulating material formed on the uppermost insulating layer so as to cover the first metal pattern; and a third metal pattern formed on the second insulating material.

9. The multilayered substrate of claim 1, wherein an upper surface of the high melting point metal layer is covered by a surface of the low melting point metal layer, and a lower surface of the high melting point metal layer is covered by the embedded conductive pattern.

* * * * *